(12) United States Patent
Takahashi et al.

(10) Patent No.: US 6,237,490 B1
(45) Date of Patent: May 29, 2001

(54) SCREEN PRINTING METHOD AND SCREEN PRINTING APPARATUS

(75) Inventors: Ken Takahashi, Nakakoma-gun; Naoichi Chikahisa, Kofu; Yousuke Nagasawa, Nakakoma-gun; Takao Naito, Nakakoma-gun; Akihiko Wachi, Nakakoma-gun; Seishiro Yanachi, Kofu; Nobuyasu Nagafuku, Nakakoma-gun; Nobuyuki Kakishima, Kofu, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/011,979

(22) PCT Filed: Aug. 30, 1996

(86) PCT No.: PCT/JP96/02432

§ 371 Date: Feb. 20, 1998

§ 102(e) Date: Feb. 20, 1998

(87) PCT Pub. No.: WO97/08655

PCT Pub. Date: Mar. 6, 1997

(30) Foreign Application Priority Data

Aug. 30, 1995 (JP) ................................................. 7-220947
Sep. 22, 1995 (JP) ................................................. 7-244847
Nov. 16, 1995 (JP) ................................................. 7-298448

(51) Int. Cl.⁷ ...................................................... B41M 1/12

(52) U.S. Cl. ............................ 101/129; 101/123; 101/126

(58) Field of Search .................................. 101/114, 123, 101/124, 126, 129

(56) References Cited

U.S. PATENT DOCUMENTS

| 5,176,078 | * | 1/1993 | Homma et al. ...................... 101/126 |
|---|---|---|---|
| 5,404,806 | | 4/1995 | Proctor . |
| 5,493,969 | * | 2/1996 | Takahashi et al. .................... 101/126 |
| 5,623,872 | * | 4/1997 | Tomomatsu ........................... 101/126 |
| 5,701,821 | * | 12/1997 | Asai et al. ............................ 101/424 |
| 5,730,051 | * | 3/1998 | Takahashi et al. .................... 101/126 |
| 5,735,203 | * | 4/1998 | Taniguchi et al. .................... 101/126 |

FOREIGN PATENT DOCUMENTS

| 56-148560 | * | 11/1981 | (JP) | ...................................... 101/126 |
|---|---|---|---|---|
| 61-68247 | * | 4/1986 | (JP) | ...................................... 101/126 |
| 63-153138 | * | 6/1988 | (JP) | ...................................... 101/123 |
| 1-267039 | * | 10/1989 | (JP) | ...................................... 101/123 |

(List continued on next page.)

*Primary Examiner*—Ren Yan
(74) *Attorney, Agent, or Firm*—Wenderoth, Lind & Ponack, L.L.P.

(57) ABSTRACT

A screen printing method and apparatus for printing a circuit pattern corresponding to that of a stencil (4), onto a print-object article (1) placed on an ascendable/descendable positioning stage (2), through moving a squeegee (5a,5b) horizontally while the squeegee is pushed in on the stencil so that print paste (9) is printed to the article via the stencil. The squeegee is lifted to an extent of a push-in stroke, to which the squeegee has been pushed in on the stencil, and thereafter the article is separated away from the stencil by moving the stage downward. The board is classified into first and second areas (121,120) where values of opening sizes of the stencil along a squeegee moving direction are smaller than and not smaller than a threshold, and a speed of the squeegee at the first area is made slower than that at the second area. Upon an occurrence of print standby time during a printing operation, the print standby time is measured, and at a resumption of printing with the print standby canceled, the paste placed on the stencil during the standby time is screen-printed, by moving the squeegee at an adjusted print speed lower than the reference print speed based on a relationship between the print standby time and a print time due to the adjusted print speed after the resumption of printing.

15 Claims, 21 Drawing Sheets

FOREIGN PATENT DOCUMENTS

| | | |
|---|---|---|
| 2-60190 | 2/1990 | (JP) . |
| 3-93288 | 4/1991 | (JP) . |
| 4-14288 | 1/1992 | (JP) . |
| 4-199766 | 7/1992 | (JP) . |
| 4-236490 | 8/1992 | (JP) . |
| 4-236491 | 8/1992 | (JP) . |
| 513926 | 1/1993 | (JP) . |
| 516327 | 1/1993 | (JP) . |
| 6-942 | 1/1994 | (JP) . |
| 6-31894 | 2/1994 | (JP) . |
| 6286105 | 10/1994 | (JP) . |
| 7-76065 | 3/1995 | (JP) . |
| 7-178887 | 7/1995 | (JP) . |
| 8-11286 | 1/1996 | (JP) . |
| 8-207241 | 8/1996 | (JP) . |

* cited by examiner

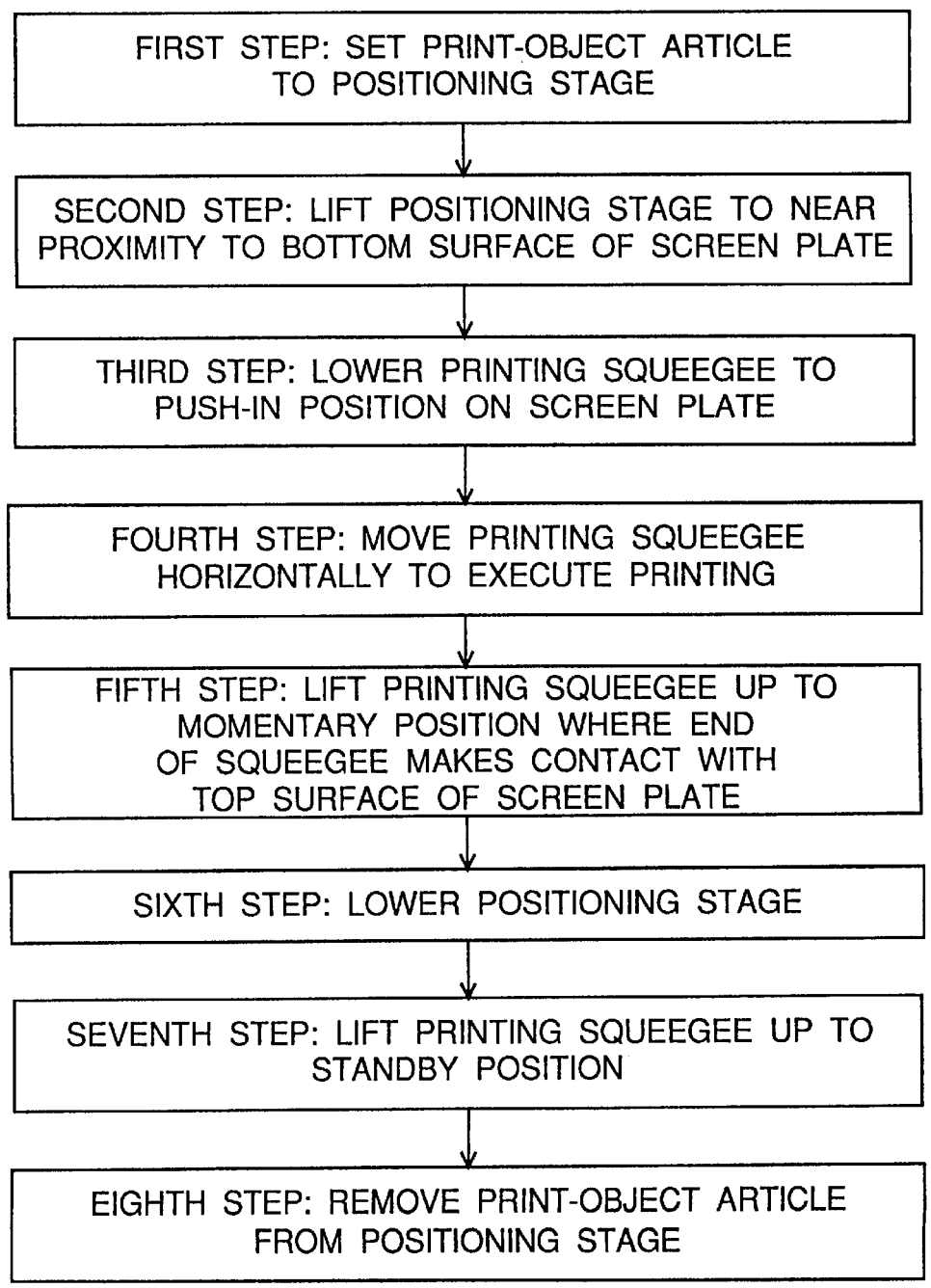

$V_1 > V_2$

SCREEN PRINTING METHOD AND SCREEN PRINTING APPARATUS

BACKGROUND OF THE INVENTION

1. Field of the Invention

The present invention relates to a screen printing method and a screen printing apparatus primarily for printing a print-use paste, such as solder paste or pastes for thick-film circuit formation, onto a board, such as a printed circuit board, for electronic circuit formation.

2. Description of the Related Art

In recent years, screen printing apparatuses have been used for the solder paste printing process in circuit assembly processes of electronic components, or the like. As the board for electronic circuit formation is advanced toward a further fine structure with the miniaturization of electronic equipment, there has been a demand for higher precision of printing with solder paste or the like responsively.

FIG. 16 shows a conventional screen printing apparatus.

A print-object article (article to be printed) 1 is positioned and fixed to a positioning stage 2 that can be ascended and descended by a positioning stage ascent/descent driving means 3. For printing process, the positioning stage 2 is lifted by the positioning stage ascent/descent driving means 3 to such an extent that the top surface of the print-object article 1 comes in near contact with the bottom surface of a stencil 4.

A left-squeegee ascent/descent driving means 6a and a right-squeegee ascent/descent driving means 6b, which are commonly implemented by double-rod air cylinders, have squeegees 5a, 5b attached to their ends. Lower-limit positions of the squeegees 5a, 5b, (i.e., the push-in strokes to the stencil 4) are set by positional adjustment of stoppers 7a, 7b. A drive source for a horizontal reciprocation driving means 8 is commonly an AC servo motor. In the state that the left squeegee 5a and the right squeegee 5b have descended into contact with the top surface of the stencil 4, the horizontal reciprocation driving means 8 moves the left squeegee 5a and the right squeegee 5b horizontally (in the X-direction), so that a print paste 9, such as solder paste, is moved on the top surface of the stencil 4 by the left squeegee 5a and the right squeegee 5b.

The printing process is carried out as shown in FIG. 17.

At the first step, the print-object article 1 is positioned and fixed to the positioning stage 2. At the second step, the print-object article 1 is lifted to a proximity of the bottom surface of the stencil 4. The left squeegee 5a is lowered at the third step, and the left squeegee 5a is moved rightward in the X-direction at the fourth step, by which printing is executed.

Thereafter, the print-object article 1 is separated away from the stencil 4 at a low speed (20 m/sec) at the fifth step, the left squeegee 5a is lifted at the sixth step, and the print-object article 1 is removed at the seventh step.

Next, a printing operation on the right squeegee 5b side is also executed in the same way as above, and the operation is then alternately repeated.

The drive source for the positioning stage ascent/descent driving means 3 is commonly an air cylinder, pulse motor, AC servo motor, or the like. Among these, the AC servo motor is particularly suitable, because low-speed descent of the driving means 3 allows an easy accomplishment of high-precision printing results with less spread and blurs (i.e., less making indistinct and hazy in outline). The left squeegee 5a and the right squeegee 5b are given mainly by elastic material, commonly urethane rubber (hardness: Hs 60–90°).

In this way, successful prints free from spread and blurs can be obtained continuously. However, there are issues as shown in FIGS. 18A to 18C.

FIG. 18A shows a completion state of the fourth step, FIG. 18B shows an early-stage state of the fifth step, and FIG. 18C shows a last-stage state of the fifth step. In the completion state of the fourth step as shown in FIG. 18A, a print pattern 11a has been formed with relatively good precision. In this state, the left squeegee 5a is curved only by a portion corresponding to the push-in stroke into the stencil 4.

In FIG. 18B, the left squeegee 5a pushes down the stencil 4 to an extent of the push-in stroke, so that the stencil 4 is tilted, causing the print pattern to gradually collapse as shown by a print pattern 11b. As a result, as shown in FIG. 18C, a horn 10 with the print paste 9 lifted is formed at a corner portion of a print pattern 11c.

The horn 10 of the print paste 9 would gradually bow, and drop onto the print-object article 1, causing printing faults as an issue.

As an example, in electronic component assembling processes typified by solder paste printing, the solder paste bowed and dropped after the subsequent-process soldering reflow would cause soldering faults such as solder balls and solder bridges.

In recent years, in the fields of screen printing methods and apparatuses therefor, there have increasingly been cases where screen printing is executed on boards on which an area corresponding to a large opening area of a screen metal mask (stencil) and an area corresponding to a minute opening area thereof are mixedly present in circuits. The term "minute opening area" refers to an area where the value of each opening size of openings of the mask along the squeegee's moving direction is smaller than a specified threshold. The term "large opening area" refers to an area where the value of each opening size of openings of the mask along the squeegee's moving direction is not smaller than a specified threshold.

Now a case where a board in which an area corresponding to a large opening area of the mask and an area corresponding to a minute opening area thereof are mixedly present in circuits is screen-printed by a conventional screen printing method and apparatus therefor is described with reference to FIGS. 19 to 22.

Referring to FIG. 19, which is a perspective view of the screen printing apparatus, reference numeral 101 denotes a screen metal mask; 102 denotes a board; 803 denotes a print head; 104 denotes a print-head-use AC servo motor for driving the print head 803; 105 denotes a print-head-use ball screw for transferring the driving force of the print-head-use AC servo motor 104; 106 denotes a print-head-use AC servo driver for driving the print-head-use AC servo motor 104; 107 denotes a visual recognition camera for recognizing recognition marks of the screen metal mask 101 and the board 102; 108 denotes a recognition-camera-use AC servo motor for driving the visual recognition camera 107; 109 denotes a recognition-camera-use ball screw for transferring the driving force of the recognition-camera-use AC servo motor 108; 110 denotes a recognition-camera-use AC servo driver for driving the recognition-camera-use AC servo motor 108; 811 denotes a controller for issuing commands to the individual servo motor drivers; 112 denotes a control panel for entering data into the controller 811; 113 denotes a stage for restricting the board 102; 114 denotes a stage-use AC servo motor for driving the stage 113; 115 denotes a stage-use ball screw for transferring the driving force of the stage-use AC servo motor 114; 116 denotes a stage-use AC servo driver for driving the stage-use AC servo motor 114; 117 denotes a loader for carrying in the unprinted board 102; 118 denotes an unloader for carrying out the printed board 102; and 119 denotes the main unit of the screen printing apparatus.

Referring to FIG. 20, which is a plan view of the screen metal mask 101, reference numeral 120 denotes a large opening area where solder paste in large openings of the mask 101 are printed on the board 102 (e.g. an area corresponding to a chip component area of the board 102) and 121 denotes a minute opening area, where solder paste in minute openings of the mask 101 are printed on the board 102 (e.g. an area corresponding to a narrow-pitch QFP (Quad Flat Package) area of the board 102).

The operation of the screen printing apparatus which employs a conventional screen printing method is explained with reference to FIGS. 19 to 22.

At Step #901 of FIG. 22, which shows the flow chart of the conventional example, an operator, with the use of the control panel 112, enters descent/ascent positions, i.e. a print start position and a print end position, of a squeegee 123 of the print head 803 in accordance with the screen metal mask 101, and enters a print speed V that allows the circuits of the board 102 to be printed stably and appropriately. In this case, the print speed V that allows a stable and an appropriate printing becomes such a low print speed that printing can be stably and appropriately performed on areas out of the circuits constituting the board 102 which correspond to most minute opening areas of the mask.

At Step #902, the loader 117 carries the board 102 into the stage 113.

At Step #903, the visual recognition camera 107 recognizes the position of the recognition mark of the board 102, performs a calculation of positional correction amount based on the position of the recognition mark of the screen metal mask 101, and performs the correction for the positioning of the board 102.

At Step #904, the squeegee 123 of the print head 803 moves and descends to the print start position, prints from the print start position to the print end position at the same print speed V entered at Step #901, and ascends.

At Step #905, the stage 113 on which the board 102 is placed descends so that the board 102 is transferred to the unloader 118, and the unloader 118 carries the board 102 out of the screen printing apparatus main unit 119.

However, in this conventional construction, since the speed of the squeegee 123 is constant, such a low print speed that printing can be appropriately performed on areas among the circuits constituting the board 102 which correspond to most minute opening areas of the mask is employed as the speed that allows the whole circuits of the board 102 to be printed stably and appropriately.

The reason of this is that, in the printing using the squeegee 123, if the minute opening area 121 of the screen metal mask 101 as shown in FIG. 20 was printed at a high print speed suitable for the large opening area 120 of the screen metal mask 101, as shown in FIG. 21A, the speed V of the squeegee 123 would be so fast that solder paste 122 could not fill the interior of a print hole 124 of the screen metal mask 101 positioned onto an electrode 125 of the board 102 and that, as a result, the quantity of the solder paste 122 to be printed on the electrode 125 of the board 102 would lack after the removal of the screen metal mask 101, as shown in FIG. 21B.

Accordingly, for the conventional printing apparatus, when the large opening area 120 and the minute opening area 121 are mixedly present, there is an issue that a longer process time for printing would be required because the low print speed for the minute opening area 121 is used even for the large opening area 120 that could be printed at the high print speed.

Another conventional example is explained with reference to FIGS. 12 to 14 and 23 showing a screen printing apparatus, as well as to FIG. 24 showing the flow chart of a conventional printing method.

The stage 2, on which a print-target article such as a printed circuit board 1 carried in from the preceding step is placed and positionally restricted, ascends up to the bottom surface of the stencil 4. After the printing, the stage 2 descends so that the printed circuit board 1 is carried out to the subsequent step. The leftward-printing squeegee 5a and the rightward-printing squeegee 5b are moved up and down by a squeegee ascent/descent driving means, while the squeegees 5a, 5b are also moved rightward and leftward by a horizontal mover 8c having a nut screwed to a screw shaft 8b with the screw shaft 8b being rotated as the motor 8a of the horizontal reciprocation driving means 8 rotates. As a result, the solder paste 9, which is an example of the print paste, placed on the stencil 4 is printed onto the printed circuit board 1 via the stencil 4. FIGS. 12 and 13 each show a state during a rightward printing process, and FIG. 14 shows a leftward-printing standby state. Reference numeral 812 in FIG. 23 denotes an NC unit that issues a command for driving the motor 8a, and 811 denotes a controller for controlling the whole printing apparatus.

Next, the operation of the conventional example is explained with reference to the flow chart of FIG. 24 as well as FIGS. 12 to 14 and 23.

First, a preset print speed V (mm/sec) is entered from the controller 811 to the NC unit 812 as the moving speed of the squeegee. This allows the NC unit 812 to control the motor 8a so that the left and right squeegees 5a, 5b move at the input print speed V.

At Step #101, a printed circuit board carry-in step, of FIG. 24, the printed circuit board 1 carried in from the preceding step is placed and positionally restricted on the stage 2, in which state the stage 2 ascends so that the top surface of the printed circuit board 1 placed thereon is put into contact with the bottom surface of the stencil 4.

At Step #102, a printing step, as described above, the motor 8a rotates under the control of the NC unit 812, so that the left squeegee 5a or the right squeegee 5b moves at the print speed V, by which the solder paste 9 placed on the stencil 4 is passed through the stencil 4 so as to be printed on the printed circuit board 1. In this process, it is an optimum state that the solder paste 9, during the printing process, be pressed by the squeegee 5a so as to roll and move on the stencil 4 (i.e., that the solder paste 9 be in a rolling state). Such a state of the solder paste 9 results in a successful printed pattern as well as a good screen-pass performance.

At Step #103, a printed circuit board carry-out step, upon completion of the printing, the motor 8a halts, the left squeegee 5a ascends, the stage 2 lowers, and the printed circuit board 1 is carried out to the subsequent step.

At Step #104, a decision step, it is decided whether or not the planned number of works has been completed. If it has not, the program returns to Step #101, and if it has been completed, the program comes to an end.

However, with this conventional constitution, there may occur print standby time durations due to the circumstances of the preceding and subsequent steps in which the printed circuit board 1 is carried in or out, or to rest time and the like. Then, a prolonged print standby time would cause the thixotropy ratio of the solder paste 9 to be lowered and the solder paste 9 placed on the stencil 4 to be dried such that its viscosity would increase. In this state of the solder paste 9, with the print standby canceled, when the printed circuit board 1 is carried in and positioned so that the printing is started, the left squeegee 5a moves at the print speed V previously entered to the NC unit 812. In this state, the solder paste 9, whose thixotropy ratio has decreased and whose viscosity also has increased, would be printed in a state other than appropriate rolling. This would cause the occurrence of such faults as solder paste chipping, solder shortages, or blurs, posing an issue that defective boards may be produced.

SUMMARY OF THE INVENTION

An object of the present invention is to provide a screen printing method and a screen printing apparatus capable of printing with good print quality.

More specifically, an object of the present invention is to provide a screen printing method and a screen printing apparatus capable of achieving a good printing result in which the corner portions of the print paste are prevented from the formation of horns. Another object of the present invention is to provide a screen printing method and an apparatus therefor capable of printing, with solder paste, boards in which areas corresponding to a large opening area and a minute opening area of a screen metal mask (stencil) are mixedly present, with high quality and high efficiency. A further object of the present invention is to provide a printing method and a printing apparatus in which such faults as solder paste chipping, solder shortages, or blurs will not occur when the print standby state is canceled and the printing process is resumed.

According to a first aspect of the present invention, there is provided a screen printing method for printing a circuit pattern corresponding to a circuit pattern of a stencil, onto a print-object article placed on an ascendable/descendable positioning stage, through a step of moving a squeegee horizontally while the squeegee is pushed in on a top surface of the stencil having the circuit pattern formed thereon so that print paste is printed and applied to the print-object article via the stencil, the screen printing method comprising steps of:

lifting the squeegee at least to an extent of a push-in stroke, to which the squeegee has been pushed in on the stencil; and thereafter, separating the print-object article away from a bottom surface of the stencil by moving the positioning stage downward.

According to a second aspect of the present invention, there is provided the screen printing method according to the first aspect, in which an ascent standby position of the squeegee above the stencil prior to the pushing-in, a push-in position of the squeegee to the stencil, and a momentary position at which the squeegee is present at a moment when the squeegee makes contact with the top surface of the stencil are entered each in numerical value into a controller of a screen printing apparatus, and in which the controller makes the following specified operations executed at the positions entered in numerical value, the screen printing method comprising, before the lifting and separating steps, steps of:

keeping the squeegee on standby at the ascent standby position before a start of the screen printing; and lowering the squeegee from the ascent standby position to the push-in position, and making the squeegee execute the push-in operation to thereby execute a printing operation, wherein in the lifting step, upon completion of the printing operation, the squeegee is lifted from the push-in position to the momentary position at which the squeegee is present at a moment when the squeegee makes contact with the top surface of the stencil.

According to a third aspect of the present invention, there is provided the screen printing method according to the first or second aspect, wherein the squeegee is moved up and down relative to the stencil by digital control.

According to a fourth aspect of the present invention, there is provided a screen printing apparatus for printing a circuit pattern corresponding to a circuit pattern of a stencil, onto a print-object article, the apparatus comprising:

an ascendable/descendable positioning stage for placing the print-object article thereon, moving the print-object article upward, and moving the print-object article downward so as to separate the print-object article away from a bottom surface of the stencil;

a squeegee for moving horizontally while the squeegee is pushed in on a top surface of the stencil having the circuit pattern formed thereon so that print paste is printed and applied to the print-object article via the stencil, the squeegee being lifted at least to an extent of a push-in stroke, to which the squeegee has been pushed in on the stencil; and a controller for controlling a squeegee ascent/descent driving unit and a positioning stage ascent/descent driving unit in such a way that after the squeegee is lifted at least to the extent of the push-in stroke, the print-object article is separated away from the bottom surface of the stencil by moving the positioning stage downward.

According to a fifth aspect of the present invention, there is provided the screen printing apparatus according to the fourth aspect, in which an ascent standby position of the squeegee above the stencil prior to the pushing-in, a push-in position of the squeegee to the stencil to which the squeegee has been pushed in on the stencil, and a momentary position at which the squeegee is present at a moment when the squeegee makes contact with the top surface of the stencil are entered each in numerical value from an input means into the controller, and in which the controller makes the following specified operations executed at the positions entered in numerical value, wherein the squeegee is brought and kept on standby at the ascent standby position by the squeegee ascent/descent driving unit before a start of the screen printing;

the squeegee is lowered from the ascent standby position to the push-in position by the squeegee ascent/descent driving unit, and the squeegee is made to execute the push-in operation to thereby execute a printing operation;

upon completion of the printing operation, when the squeegee is lifted to the extent of the push-in stroke, the squeegee is lifted by the squeegee ascent/descent driving unit from the push-in position to the momentary position at which the squeegee is present at a moment when the squeegee makes contact with the top surface of the stencil; and the positioning stage is lowered by the positioning stage ascent/descent driving unit so as to separate the print-target article away from the bottom surface of the stencil.

According to a sixth aspect of the present invention, there is provided the screen printing apparatus according to the fourth or fifth aspect, wherein the squeegee ascent/descent driving unit comprises a motor, a screw shaft connected to a rotary shaft of the motor, and a mover which is screwed to the screw shaft and which moves the squeegee along upward and downward directions, wherein the upward and downward movement of the squeegee is controlled by rotational control of the motor.

According to a seventh aspect of the present invention, there is provided the screen printing apparatus according to any one of the fourth through sixth aspects, wherein the squeegee is moved up and down relative to the stencil by digital control with the controller.

According to an eighth aspect of the present invention, there is provided the screen printing apparatus according to any one of the fourth through seventh aspects, wherein after the squeegee is lifted by the squeegee ascent/descent driving unit at least to the extent of the push-in stroke, to which the squeegee has been pushed in on the stencil, the positioning stage moves downward by the positioning stage ascent/descent driving unit at a speed slower than a speed at which the squeegee is lifted, whereby the print-object article is separated away from the bottom surface of the stencil, and thereafter the squeegee is lifted up to its standby position by the squeegee ascent/descent driving unit.

According to a ninth aspect of the present invention, there is provided a screen printing method for printing, with use of a screen printing apparatus, solder paste on an electrode of a board to be printed, by positioning a screen mask onto the board and by printing the solder paste supplied onto the screen mask into the screen mask with a squeegee of a print head which moves parallel to the screen mask while being kept in contact with the screen mask, wherein the board is classified into a first area where a value of each of opening sizes of the mask along a direction in which the squeegee moves is smaller than a specified threshold, and a second area where a value of each of opening sizes of the mask is not smaller than the threshold, and a speed of the squeegee at the first area is made slower than a speed of the squeegee at the second area.

According to a tenth aspect of the present invention, there is provided the screen printing method according to the ninth aspect, further comprising steps of:

entering data of the first area and the second area as well as data of the squeegee speeds corresponding to the first area and the second area, into the screen printing apparatus by an operator or from a higher-order computer that controls the screen printing apparatus; and switching the squeegee speed between the first and second areas based on the entered data of the first area and the second area as well as the data of the squeegee speeds corresponding to the first area and the second area.

According to an 11th aspect of the present invention, there is provided the screen printing method according to the ninth aspect, further comprising steps of:

entering data of the first area and the second area into the screen printing apparatus by recognizing the opening sizes of the mask by a visual recognition camera, and entering into the screen printing apparatus data of the squeegee speeds corresponding to the first area and the second area by an operator or a higher-order computer that controls the screen printing apparatus; and switching the squeegee speed between the first and second areas based on the entered data of the first area and the second area by the recognition of the visual recognition camera and the entered data of the squeegee speeds corresponding to the first area and the second area by the operator or the higher-order computer.

According to a 12th aspect of the present invention, there is provided the screen printing method according to any one of the 9th to 11th aspects, wherein when openings where a value of each of opening sizes of the mask along the squeegee's moving direction is smaller than a specified threshold and openings where a value of each of opening sizes of the mask along the squeegee's moving direction is not smaller than the specified threshold are mixedly present along a direction intersecting the squeegee's moving direction, the squeegee is moved at the speed corresponding to the first area by assuming as the first area based on the smaller opening sizes.

According to a 13th aspect of the present invention, there is provided the screen printing method according to any one of the 9th to 12th aspects, wherein when external terminals of components to be mounted to the board are placed on the solder paste formed by the printing, the threshold is a pitch between the external terminals.

According to a 14th aspect of the present invention, there is provided a screen printing apparatus for printing solder paste on an electrode of a board to be printed, by positioning a screen mask onto the board and by printing the solder paste supplied onto the screen mask into the screen mask with a squeegee of a print head which moves parallel to the screen mask while being kept in contact with the screen mask, the screen printing apparatus comprising:

a controller for executing control process in such a way that the board is classified into a first area where a value of each of opening sizes of the mask along a direction in which the squeegee moves is smaller than a specified threshold, and a second area where a value of each of opening sizes is not smaller than the threshold, and that a speed of the squeegee at the first area is made slower than a speed of the squeegee at the second area.

According to a 15th aspect of the present invention, there is provided the screen printing apparatus according to the 14th aspect, wherein data of the first area and the second area as well as data of the squeegee speeds corresponding to the first area and the second area are entered into the controller by an operator or a higher-order computer that controls the controller, and wherein the squeegee speed is switched between the first and second areas by the controller based on these entered data.

According to a 16th aspect of the present invention, there is provided the screen printing apparatus according to the 14th aspect, further comprising a visual recognition camera for recognizing a state of openings of the mask, wherein data of the first area and the second area are entered into the controller by the visual recognition camera recognizing the openings of the mask, and data of the squeegee speeds corresponding to the first area and the second area are entered by an operator or a higher-order computer that controls the controller, and wherein the squeegee speed is switched between the first and second areas by the controller based on these entered data.

According to a 17th aspect of the present invention, there is provided the screen printing apparatus according to any one of the 14th to 16th aspects, wherein when openings where a value of each of opening sizes of the mask along the squeegee's moving direction is smaller than a specified threshold and openings where a value of each of opening sizes of the mask along the squeegee's moving direction is not smaller than the specified threshold are mixedly present along a direction intersecting the squeegee's moving direction, the controller makes the squeegee move at the speed corresponding to the first area by assuming as the first area based on the smaller opening sizes.

According to an 18th aspect of the present invention, there is provided the screen printing apparatus according to any one of the 14th to 17th aspects, wherein when external terminals of components to be mounted to the board are placed on the solder paste formed by the printing, the threshold is a pitch between the external terminals.

According to a 19th aspect of the present invention, there is provided the screen printing apparatus according to any one of the 14th to 18th aspects, further comprising:

a loader for carrying in a board on which the solder paste is to be printed;

a stage for holding the board, which has been carried in by the loader, to perform screen printing on the board; and an unloader for carrying out the board, on which the solder paste has been printed, from the stage, the controller comprising:

storage means for storing data for classifying the board into the first area where the value of each of the opening sizes of the mask along the direction in which the squeegee moves is smaller than the specified threshold, and the second area where the value of each of the opening sizes is not smaller than the threshold, data of the squeegee speed at the first area, and data of the squeegee speed at the second area slower than the squeegee speed at the first area; and program generating means for generating a program by which the squeegee speed of the print head is switched on the way of a printing process based on the data stored in the storage means, and the print head comprising squeegee-speed on-process switching means for switching the squeegee speed on the way of the printing process based on control of the controller in accordance with the program.

According to a 20th aspect of the present invention, there is provided a screen printing method for screen printing solder paste at a reference print speed by using a squeegee, the screen printing method comprising:

a step for, upon an occurrence of print standby time during a printing operation, measuring the print standby time; and a step for, at a resumption of printing with the print standby canceled, screen-printing the solder paste placed on a screen mask during the standby time, by moving the squeegee at an adjusted print speed lower than the reference print speed based on a relationship between the print standby time and a print time due to the adjusted print speed after the resumption of printing.

According to a 21st aspect of the present invention, there is provided the screen printing method according to the 20th aspect, wherein a time for which the screen printing is executed at the adjusted print speed is set according to a resupply amount of the solder paste.

According to a 22nd aspect of the present invention, there is provided the screen printing method according to the 20th or 21st aspect, wherein over a specified time elapse after the screen printing is started at the adjusted print speed, the screen printing is executed at the reference print speed.

According to a 23rd aspect of the present invention, there is provided the screen printing method according to the 20th or 21st aspect, wherein upon completion of the screen printing of a specified number of boards after the screen printing is started at the adjusted print speed, the screen printing is executed at the reference print speed.

According to a 24th aspect of the present invention, there is provided the screen printing method according to any one of the 20th to 23rd aspects, wherein the adjusted print speed until the print speed is returned to the reference print speed is set into a plurality of steps.

According to a 25th aspect of the present invention, there is provided a screen printing apparatus for screen printing solder paste at a reference print speed by using a squeegee, the screen printing apparatus comprising:

a controller for, upon an occurrence of print standby time during a printing operation, measuring the print standby time, and for, at a resumption of printing with the print standby canceled, screen-printing the solder paste placed on a screen mask during the standby time, by moving the squeegee at an adjusted print speed lower than the reference print speed based on a relationship between the print standby time and a print time due to the adjusted print speed after the resumption of printing.

According to a 26th aspect of the present invention, there is provided the screen printing apparatus according to the 25th aspect, wherein, by the controller, a time for which the screen printing is executed at the adjusted print speed is set according to a resupply amount of the solder paste.

According to a 27th aspect of the present invention, there is provided the screen printing apparatus according to the 25th or 26th aspect, wherein, by the controller, over a specified time elapse after the screen printing is started at the adjusted print speed, the screen printing is executed at the reference print speed.

According to a 28th aspect of the present invention, there is provided the screen printing apparatus according to the 25th or 26th aspect, wherein, by the controller, upon completion of the screen printing of a specified number of boards after the screen printing is started at the adjusted print speed, the screen printing is executed at the reference print speed.

According to a 29th aspect of the present invention, there is provided the screen printing apparatus according to any one of the 25th to 28th aspects, wherein, by the controller, the adjusted print speed until the print speed is returned to the reference print speed is set into a plurality of steps.

According to the screen printing method of the present invention, before separating the print-object article downward away from the bottom surface of the stencil with the positioning stage, the squeegee can be lifted at least to the extent of a push-in stroke, to which the printing squeegee has been pushed in on the stencil, and thereafter the print-object article can be separated downward away from the bottom surface of the stencil with the positioning stage, and after that, the printing squeegee can be lifted. Therefore, the print-object article can be separated from the stencil while the stencil is kept horizontal without being tilted. Thus, a successful print pattern generally equal to the circuit pattern provided on the stencil and having, at the corner portions, no such horns as has been involved in the conventional method can be obtained.

According to the screen printing apparatus of the present invention, the apparatus is provided with a controller for operating the printing squeegee ascent/descent driving unit and the positioning stage ascent/descent driving unit in such a way that, after the squeegee is lifted before separating the print-object article away from the bottom surface of the stencil by moving the positioning stage downward, the print-object article is separated away from the bottom surface of the stencil by moving the positioning stage downward. Therefore, the screen printing method of the present invention can be realized, so that similar effects can be produced.

In the screen printing method of the present invention and the screen printing apparatus of the invention, the controller additionally comprises: storage means for entering thereto and storing therein data relating to the settings of the large opening area and the minute opening area of the board, as well as data relating to the setting of a high squeegee speed for the large opening area and to the setting of a low squeegee speed for the minute opening area; and program generating means for generating a program by which the squeegee speed of the print head is switched on the way of a printing process based on the entered data. Further, the print head additionally comprises squeegee-speed on-process switching means for switching the squeegee speed on the way of the printing process. Therefore, by performing the input of large opening area and minute opening area as well as the input of high squeegee speed and low squeegee speed by the operator or the higher-order (host) computer that controls the screen printing apparatus, or by performing the input of large opening area and minute opening area by the recognition of the visual recognition camera as well as the input of high squeegee speed and low squeegee speed by the operator or the higher-order (host) computer, the areas where only the areas corresponding to the large opening areas of the mask are present in the board at which the print paste is to be printed are printed at the high squeegee speed while the areas where only the areas corresponding to the minute opening areas of the mask are present in the board at which the print paste is to be printed are printed at the low squeegee speed. Thus, it is enabled to maintain a high print quality and to ensure a high productivity when the large opening area and the minute opening area are mixedly present.

According to the screen printing method of the present invention, at a resumption of printing, in order that the print paste placed on the stencil during the standby time can be printed while appropriately rolling, an adjusted print speed lowered below the reference print speed is set in accordance with a change in the print paste characteristic that is discriminated based on the measured print standby time. Therefore, even if the print paste has changed in characteristic due to, for example, drying during the print standby time, printing at the adjusted print speed allows the print paste to be printed while appropriately rolling. Thus, the occurrence of such faults as print paste chipping, print paste shortages, and blurs can be eliminated.

Also, the number of adjusted prints to be printed at the adjusted print speed is set responsive to a resupply amount of new print paste, and the print speed is returned to the reference print speed after the number of adjusted prints have been printed at the adjusted print speed. Therefore, the print speed can be returned to the reference print speed without causing any faults such as print paste chipping, print paste shortages, and blurs.

According to the printing method of the present invention, a one-step adjusted print speed may properly be employed for a short print standby time, and the number of steps of adjusted print speed may be increased as the print standby time becomes longer. Therefore, a wide range of short to long print standby times can be handled successfully.

BRIEF DESCRIPTION OF DRAWING

These and other objects and features of the present invention will become apparent from the following description taken in conjunction with the preferred embodiments thereof with reference to the accompanying drawings, in which:

FIG. 2 is a flow chart of the printing method according to the first embodiment;

DETAILED DESCRIPTION OF THE INVENTION

Figure 1:
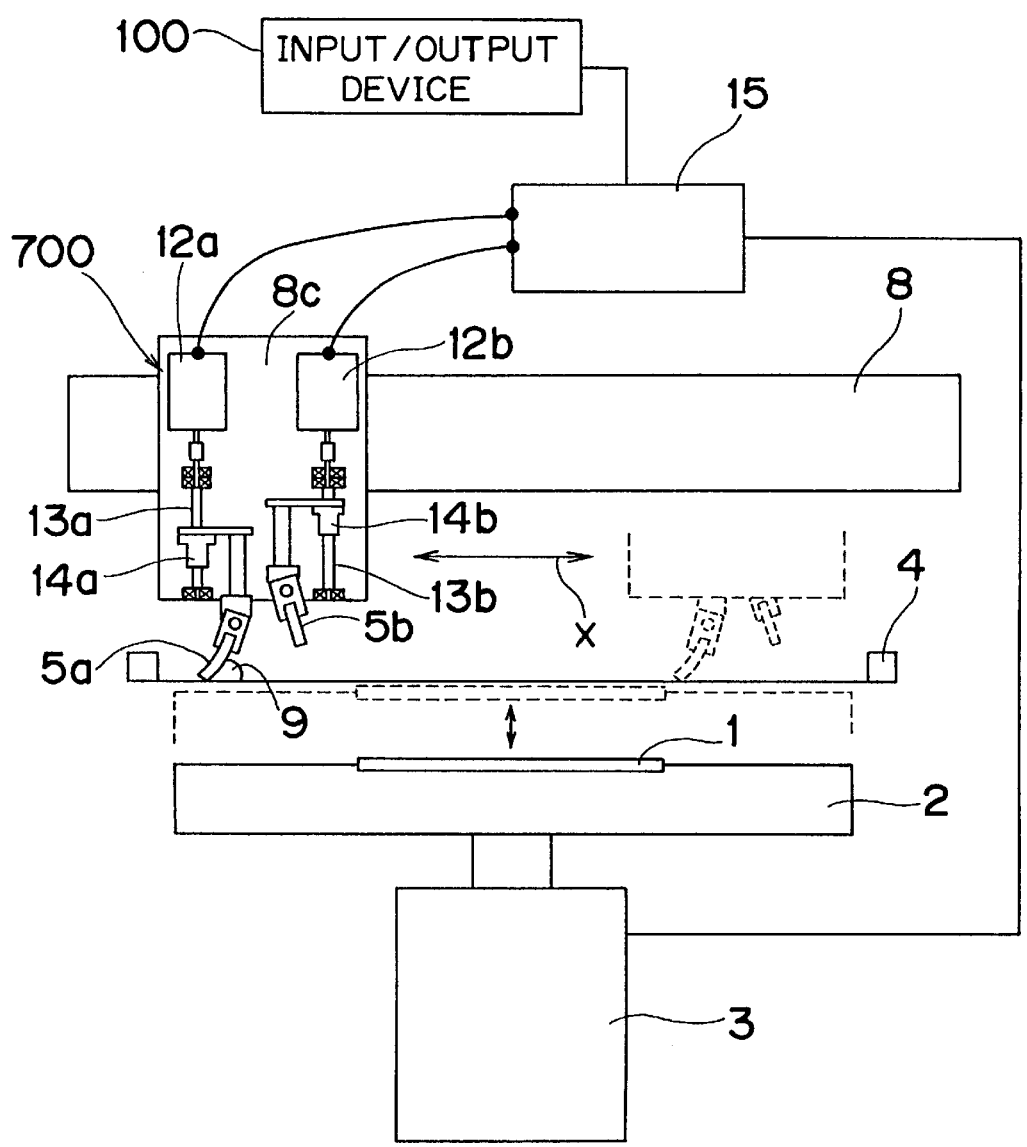
FIG. 1 is an arrangement diagram of a screen printing apparatus for carrying out a screen printing method according to a first embodiment of the present invention.

Before the description of the present invention proceeds, it is to be noted that like parts are designated by like reference numerals throughout the accompanying drawings.

A screen printing method according to a first embodiment of the present invention is described below with reference to FIGS. 1 to 3C.

FIG. 1 shows a screen printing apparatus used for carrying out the screen printing method according to the first embodiment of the present invention.

A print-object article 1 is positioned and fixed on a positioning stage 2 that can be ascended and descended by a positioning stage ascent/descent driving unit 3. For the printing process, the positioning stage 2 is lifted by the positioning stage ascent/descent driving unit 3 to such an extent that the top surface of the print-object article 1 comes in near contact with the bottom surface of a stencil 4, as shown by broken lines in FIG. 1.

Figure 12:
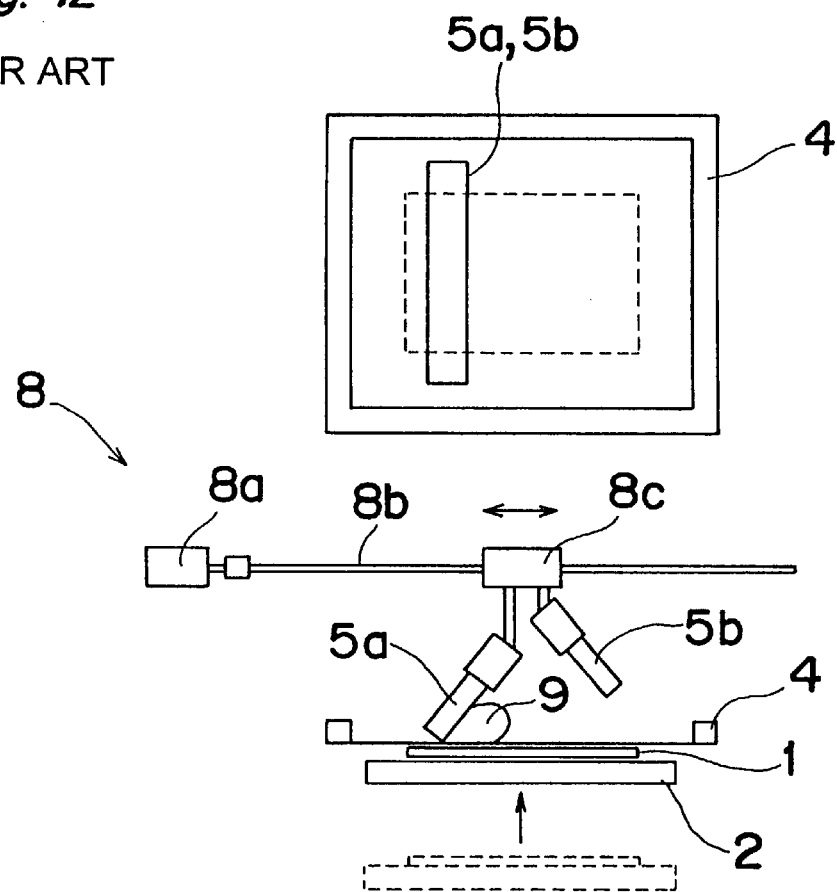
FIG. 12 is a view showing the construction and operation of a screen printing apparatus.

A horizontal reciprocation driving unit 8 comprises an AC servo motor 8a, a screw shaft 8b connected to the rotary shaft of the motor 8a, a mover 8c screwed to the screw shaft 8b, and the like, as shown in FIG. 12. In a state that a left squeegee 5a and a right squeegee 5b have descended into contact with the top surface of the stencil 4, the horizontal reciprocation driving unit 8 moves the left squeegee 5a and the right squeegee 5b horizontally in FIG. 1 (in the X-direction), by which a print paste 9, such as solder paste, is moved on the top surface of the stencil 4 by the left squeegee 5a and the right squeegee 5b.

Reference numeral 12a denotes a left-squeegee ascent/descent pulse motor for driving the left squeegee 5a for ascent and descent; 12b denotes a right-squeegee ascent/descent pulse motor for driving the right squeegee 5b for ascent and descent; 13a denotes a left ball screw which is driven into forward and reverse rotation by the left-squeegee ascent/descent pulse motor 12a; 13b denotes a right ball screw which is driven into forward and reverse rotation by the right-squeegee ascent/descent pulse motor 12b; 14a denotes a left ball screw nut which is screwed to the left ball screw 13a and which is moved up and down by the forward/reverse rotation of the left ball screw 13a; and 14b denotes a right ball screw nut which is screwed to the right ball screw 13b and which is moved up and down by the forward/reverse rotation of the right ball screw 13b. These major components constitute a printing squeegee ascent/descent driving unit 700.

Designated by reference numeral 15 is a positioning controller, which is capable of positioning the left squeegee 5a and the right squeegee 5b, which are formed from rubber or metal or the like, to specified ascent standby positions of the squeegee above the stencil prior to the pushing-in, to specified squeegee push-in stroke positions, and to momentary positions at which the left and right squeegees 5a, 5b are present at a moment when the left and right squeegees 5a, 5b make contact with the top surface of the stencil 4, respectively, according to numerical data of those positions entered from an input/output device 100, such as a ten-key pad, or to data retrieved from program data stored in a storage unit provided within the positioning controller 15, by the printing squeegee ascent/descent driving unit 700.

FIG. 2 shows the screen printing process of the screen printing method according to the first embodiment. Its primary difference from the conventional printing method is that the fifth step is added between the fourth step and the fifth step of FIG. 2 in the description of the BACKGROUND ART.

In the screen printing method according to the first embodiment of the present invention, at the first step, the print-object article 1 is positioned and fixed to a specified position of the positioning stage 2.

At the second step, the positioning stage 2 is lifted by the stage ascent/descent driving unit 3, so that the print-object article 1 on the positioning stage 2 is lifted to near proximity to the bottom surface of the stencil 4.

At the third step, the left squeegee 5a is lowered to the squeegee ascent/descent pulse motor 12a.

Figure 3A:
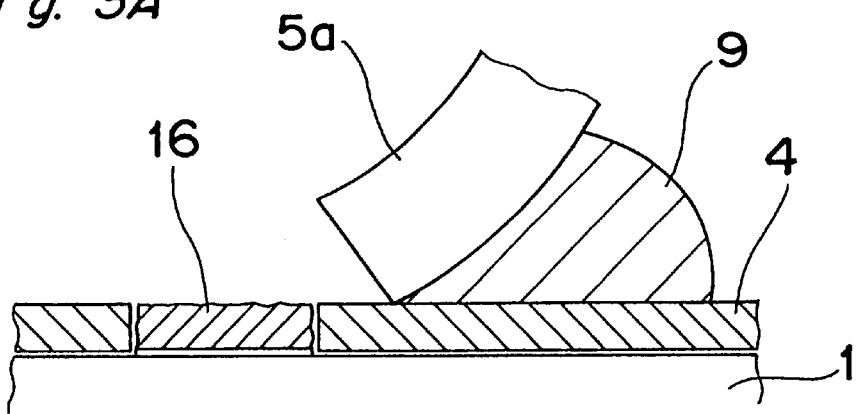
FIGS. 3A, 3B, and 3C are explanatory views of the printing process of the screen printing method according to the first embodiment.

At the fourth step, the left squeegee 5a is moved rightward in the X-direction of FIG. 1 by the horizontal reciprocation driving unit 8, by which the printing is executed. This state is shown in FIG. 3A.

Figure 3B:
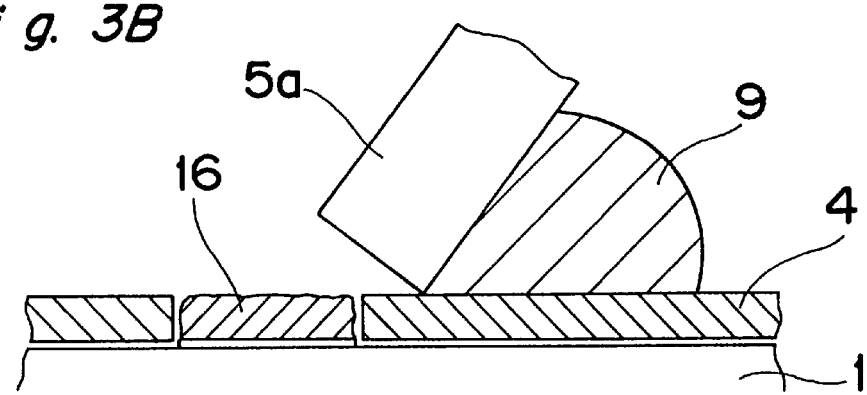

Thereafter, at the fifth step, the left squeegee 5a is lifted only to a push-in stroke, i.e., to an extent to which the printing left squeegee 5a has been pushed in on the stencil 4, by the left-squeegee ascent/descent pulse motor 12a, up to the monetary position where the left and right squeegee 5a, 5b are present at a moment when the squeegee 5a makes contact with the top surface of the stencil 4. This state is shown in FIG. 3B.

Figure 3C:
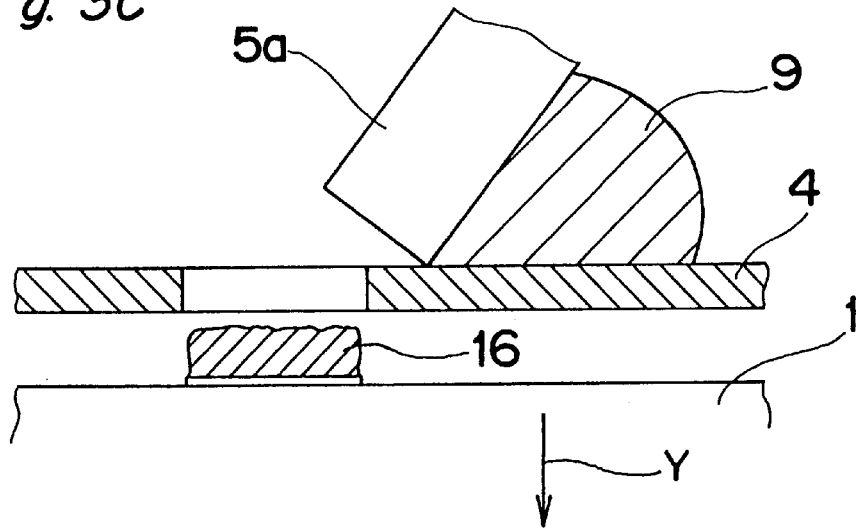

At the sixth step, the positioning stage 2 is lowered at an ultra-low speed (0.1 mm/sec) in the Y-direction of FIG. 3C by the stage ascent/descent driving unit 3 during a predetermined distance from the printing position of the board, so that the print-object article 1 is separated away from the stencil 4 as shown in FIG. 3C. Then, at the seventh step, the left squeegee 5a is lifted up to the ascent standby position by the left-squeegee ascent/descent pulse motor 12a. After the positioning stage 2 moves by the predetermined distance, the positioning stage 2 is lowered at a higher speed than the ultra-low speed, preferably. Next, a printing operation on the right squeegee 5b side is also executed in the same manner as in the left squeegee 5a, and the operation is alternately repeated from this on.

As shown above, the provision of the printing squeegee ascent/descent driving unit 700, which is composed primarily of the left-squeegee ascent/descent pulse motor 12a and the right-squeegee ascent/descent pulse motor 12b, as well as the positioning controller 15 makes it possible to optionally enter and set the momentary position where the left and right squeegees 5a, 5b are present at a moment when the left squeegee 5a and the right squeegee 5b make contact with the top surface of the stencil 4 via the input/output device 100, and moreover to lift the left squeegee 5a and the right squeegee 5b up to the momentary position at which the left and right squeegees 5a, 5b are present at a moment when they make contact with the top surface of the stencil 4, before separating the print-object article 1 away from the stencil 4. Therefore, the print-object article 1 can be separated from the stencil 4 while the stencil 4 is kept horizontal without being tilted. Thus, a successful print pattern 16 generally equal to the circuit pattern provided on the stencil 4 and having, at the corner portions, no such horns 10 as has been shown in the conventional example can be obtained.

Further, it has been arranged that the ascent standby positions of the printing squeegees 5a, 5b, the push-in positions of the squeegees 5a, 5b to the stencil 4, and the momentary positions where the left and right squeegees 5a, 5b are present at a moment when the squeegees 5a, 5b make contact with the top surface of the stencil 4 are entered in numerical value from the input/output device 100 into the positioning controller 15, respectively, so as to be stored in the storage unit, and that the controller 15 digitally controls the individual positions based on the numerical values stored in the storage unit. Therefore, those positions can be controlled with good reproducibility for each printing process so that the screen printing precision can be improved.

It has also been arranged that, after the squeegees 5a, 5b are lifted at least by the push-in stroke extent to which the squeegees 5a, 5b have been pushed in on the stencil 4, the positioning stage 2 moves downward during a predetermined distance from the printing position of the board at a speed slower than the speeds at which the squeegees 5a, 5b ascend, by which the print-object article 1 is separated away from the bottom surface of the stencil 4, and further thereafter, the squeegees 5a, 5b are lifted up to their standby positions. Therefore, the print-object article 1 can be separated away from the stencil 4 while the stencil 4 is kept horizontally more securely without being tilted. Thus, a successful print pattern 16 generally equal to the circuit pattern provided on the stencil 4 and having, at the corner portions, no such horns 10 as has been shown in the conventional example can be obtained.

A screen printing apparatus which uses a screen printing method according to a second embodiment of the present invention is described with reference to FIGS. 4A to 7B. In the following description, the term "minute opening area" refers to an area where the value of the opening size of openings of the mask along the direction in which the squeegees move is smaller than a specified threshold. The term "large opening area" refers to an area where the value of the opening size of openings of the mask along the direction in which the squeegees move is not less than the specified value.

Figure 4A:
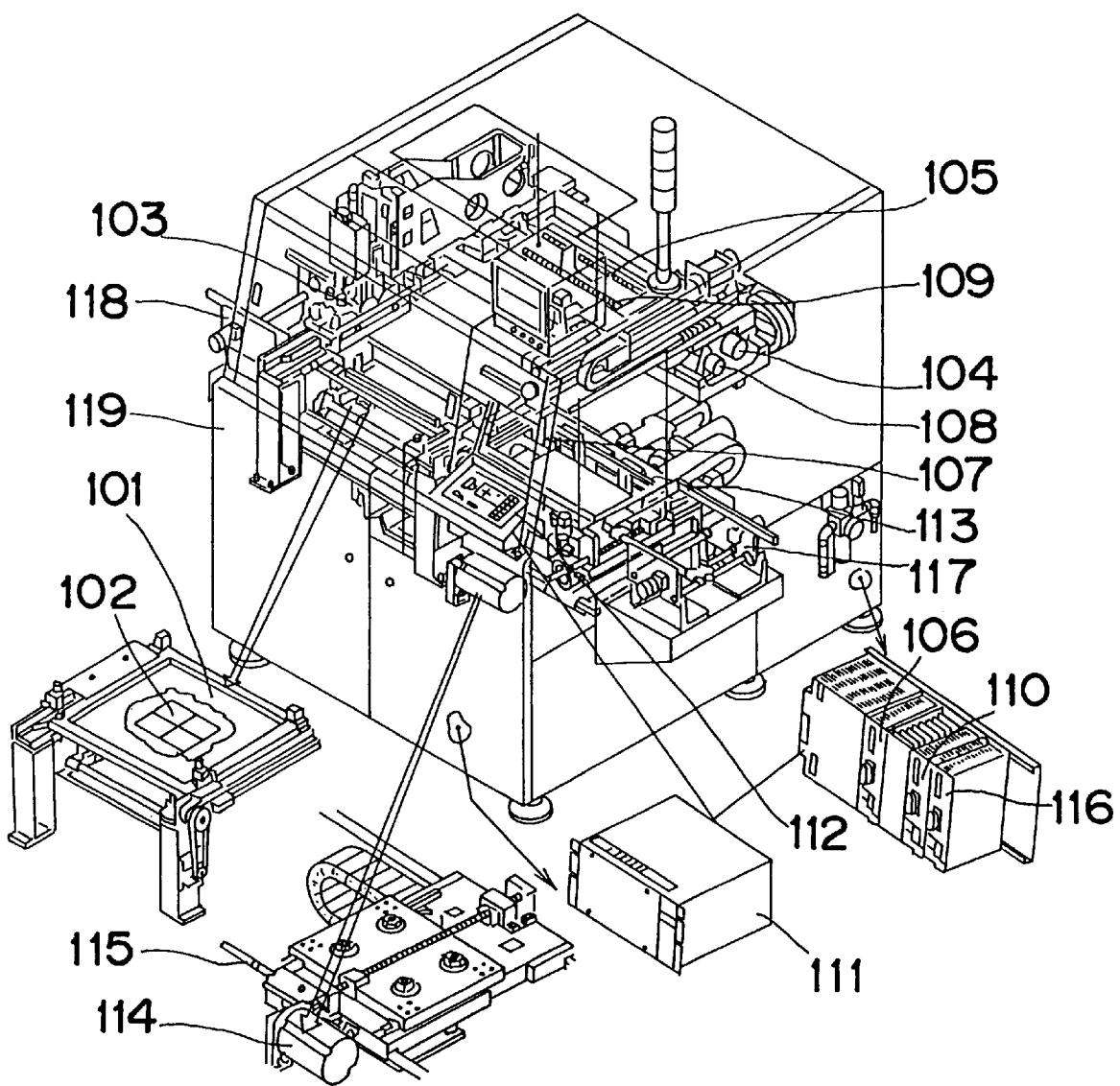
FIGS. 4A and 4B are a perspective view of a screen printing apparatus according to a second embodiment of the present invention and a diagram showing the relationship between its controller and the apparatus components, respectively.
Figure 4B:
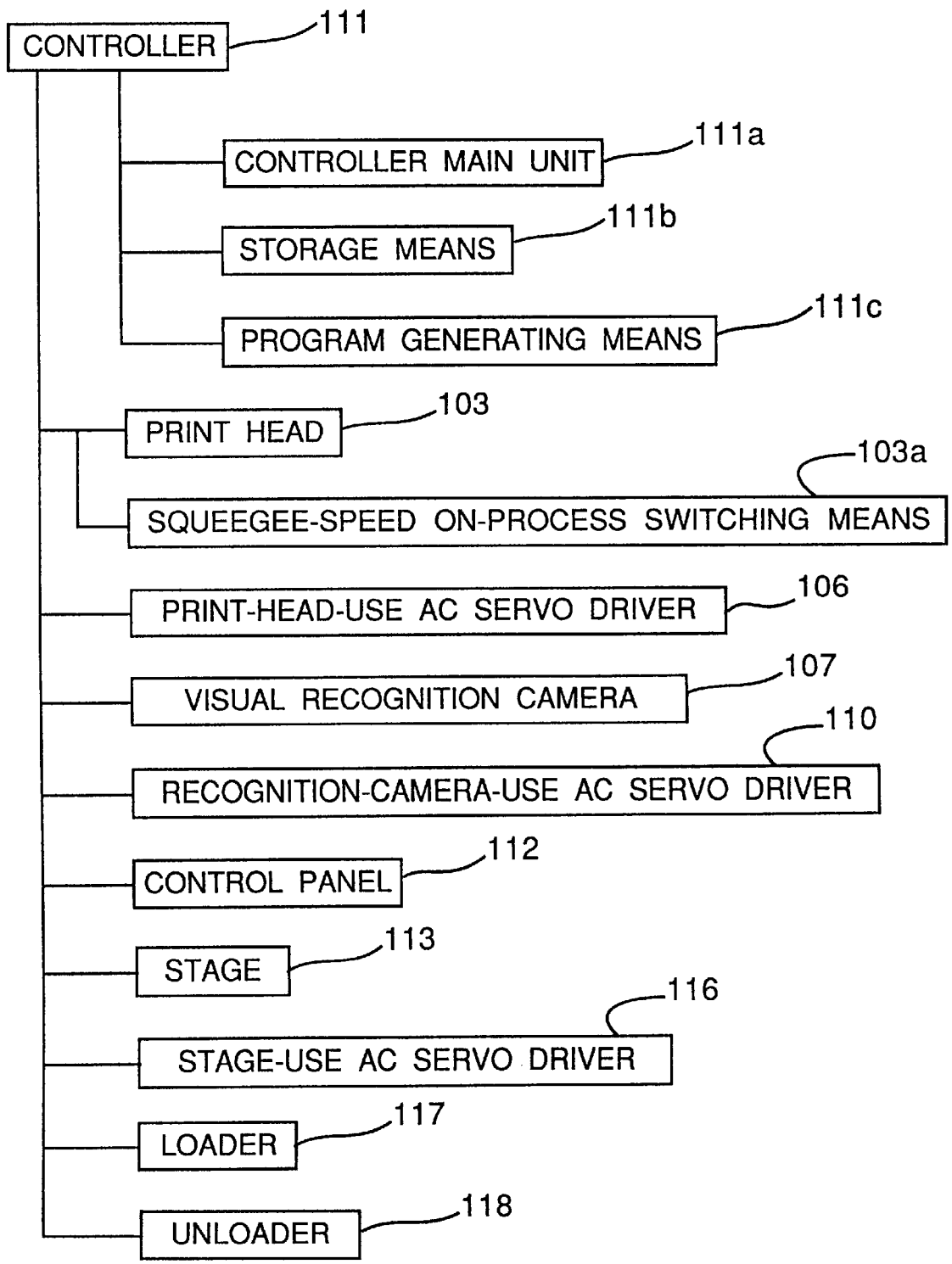

Referring to FIG. 4A, which is a perspective view of the screen printing apparatus, reference numeral 101 denotes a screen metal mask; 102 denotes a board; 103 denotes a print head; 104 denotes a print-head-use AC servo motor for driving the print head 103; 105 denotes a print-head-use ball screw for transferring the driving force of the print-head-use AC servo motor 104; 106 denotes a print-head-use AC servo driver for driving the print-head-use AC servo motor 104; 107 denotes a visual recognition camera for recognizing recognition marks of the screen metal mask 101 and the board 102; 108 denotes a recognition-camera-use AC servo motor for driving the visual recognition camera 107; 109 denotes a recognition-camera-use ball screw for transferring the driving force of the recognition-camera-use AC servo motor 108; 110 denotes a recognition-camera-use AC servo driver for driving the recognition-camera-use AC servo motor 108; 111 denotes a controller for issuing commands to the servo motor drivers 106, 110; 112 denotes a control panel for entering data to the controller 111; 113 denotes a stage for restricting the board 102; 114 denotes a stage-use AC servo motor for driving the stage 113; 115 denotes a stage-use ball screw for transferring the driving force of the stage-use AC servo motor 114; 116 denotes a stage-use AC servo driver for driving the stage-use AC servo motor 114; 117 denotes a loader for carrying in the unprinted board 102; 118 denotes an unloader for carrying out the printed board 102; and 119 denotes the apparatus main unit. Thus, to the controller 111, as shown in FIG. 4B, are connected the print head 103, the print-head-use AC servo driver 106, the visual recognition camera 107, the recognition-camera-use AC servo driver 110, the control panel 112, the stage 113, the stage-use AC servo driver 116, the loader 117, and the unloader 118.

In the second embodiment, the board 102, the stage 113, the stage-use AC servo motor 114, the screen metal mask 101, the print head 103, the squeegee 123, the solder paste 122 as an example of print paste, the controller 111, and the control panel 112 correspond to the board 1, the stage 2, the positioning stage ascent/descent driving unit 3, the stencil 4, the mover 8c that has the squeegees 5a, 5b and functions as a print head, the squeegees 5a, 5b, the solder paste 9 as an example of print paste, the controller 15, and the input/output device 100 of the first embodiment, respectively.

The apparatus of this second embodiment largely differs from the conventional apparatus in that the controller 111 additionally comprises, besides a controller main unit 111a, storage means 111b to which entered and stored are data relating to the setting of the large opening area and the minute opening area of the board 102, as well as data relating to the setting of the high squeegee speed for the large opening area and to the setting of the low squeegee speed for the minute opening area, and program generating means 111c for generating a program to switch the squeegee speed of the print head 103 on the way of process according to the entered data, and in that the print head 103 additionally comprises a squeegee-speed on-process switching means 103a for switching the squeegee speed in the course of the printing process.

In this second embodiment, it is assumed that the squeegee 123 has such a width that the entire area of the board 102 in a direction perpendicular to the squeegee's moving direction can be printed by one moving process of the squeegee. It is also assumed that moving the squeegee 123 at a print speed which will be described later allows the entire area of the board 102 to be printed in the direction perpendicular to the squeegee's moving direction.

Figure 5:
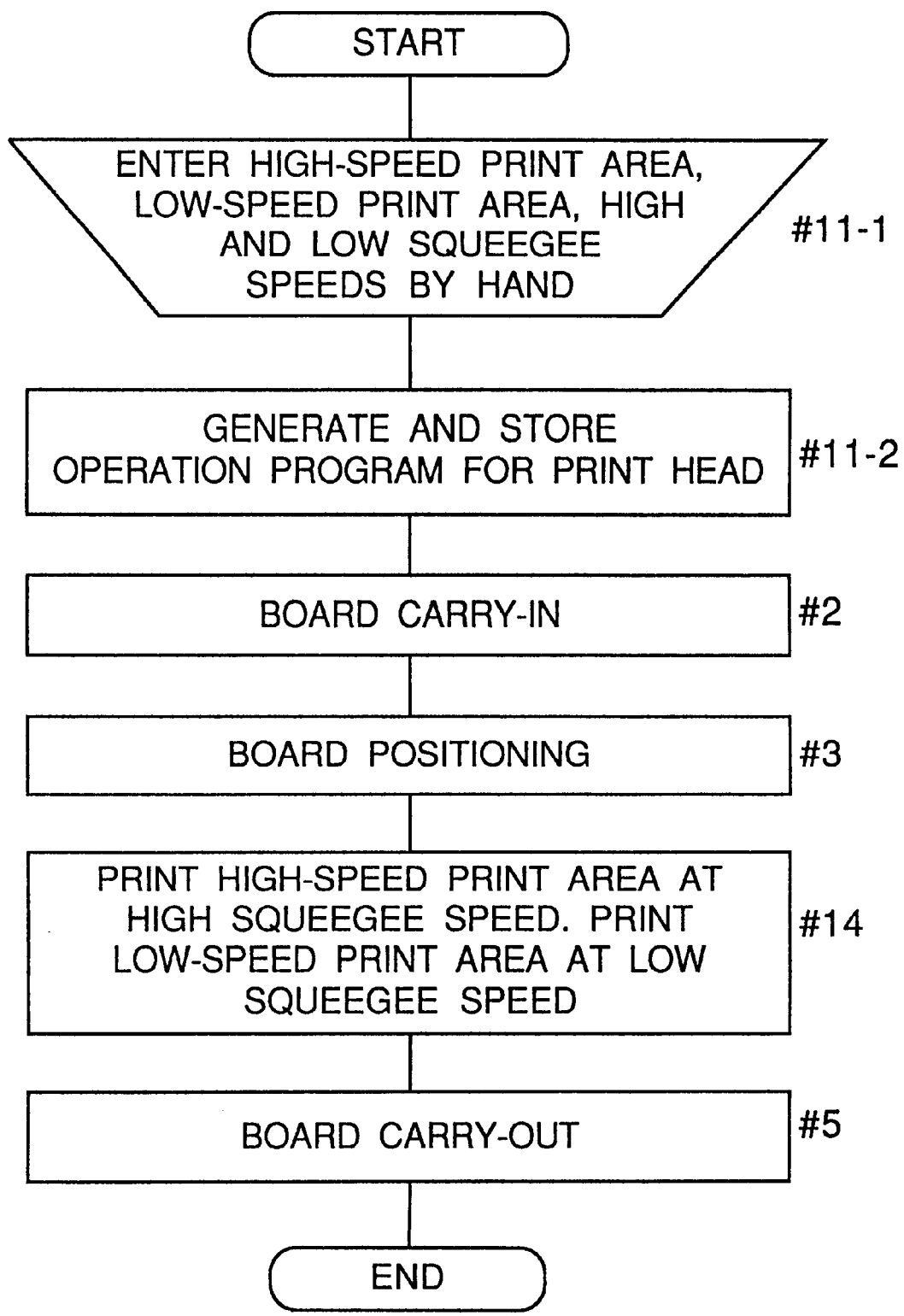
FIG. 5 is a flow chart showing the operation of the screen printing method according to the second embodiment.
Figure 6:
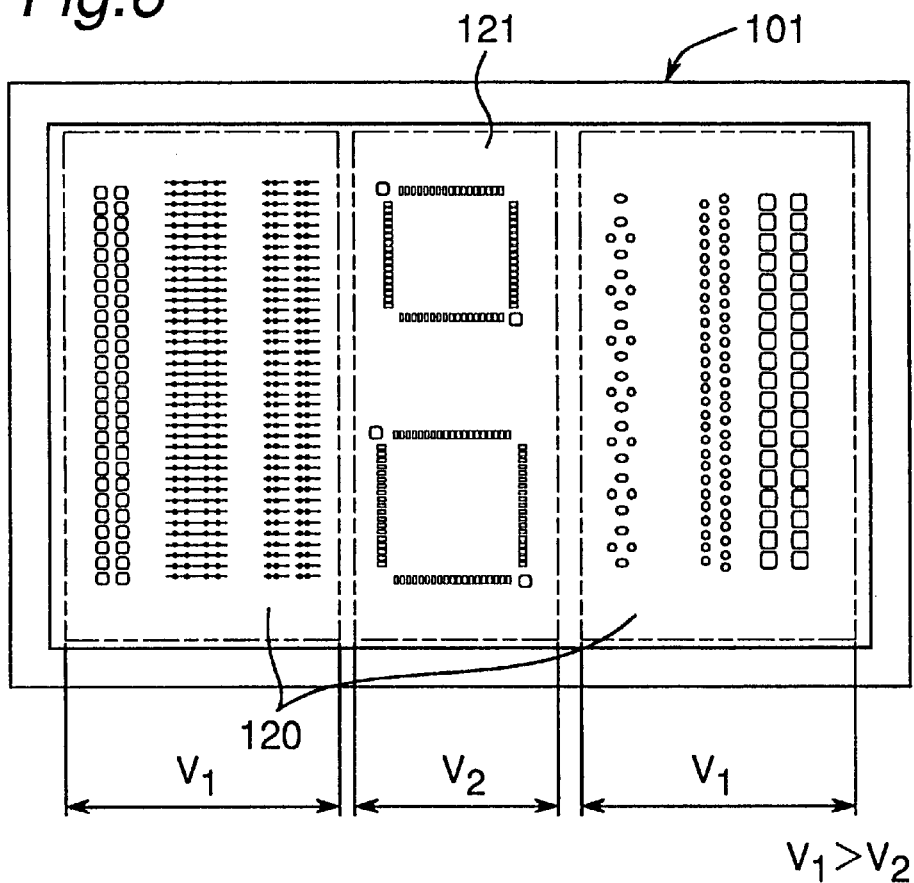
FIG. 6 is a plan view of a screen metal mask used in the printing method according to the second embodiment.

At Step #11-1 of FIG. 5, which shows the flow chart of the second embodiment, after installing the screen metal mask 101 upon a model exchange, the operator, with the use of the control panel 112, enters a large opening area 120, e.g. an area corresponding to a chip component area of the board, as a high-speed print area into the controller 111 to thereby store it into the storage means 111b, by the ten-key pad of the control panel 112 serving as an input means, while the operator enters the minute opening area 121, e.g. an area corresponding to a narrow-pitch QFP (Quad Flat Package) area of the board, as a low-speed print area into the controller 111 by the control panel 112 to thereby store it into the storage means 111b, based on the positions and sizes of the large opening area 120, which is an area where solder paste in large openings of the mask 101 is printed on the board, and the minute opening area 121, which is an area where solder paste in minute openings of the mask 101 is printed on the board, in the screen metal mask 101 as shown in FIG. 6. Moreover, the operator enters a high squeegee speed $V_1$ to be used for the printing of the high-speed print area and a low squeegee speed $V_2$ to be used for the printing of the low-speed print area, into the controller 111 to thereby store them in the storage means 111b, by the control panel 112.

At Step #11-2 of FIG. 5, with the use of these entered and stored data, the controller 111 makes the program generating means 111c generate an operation program for the print head 103 to print the large opening area 120, which is the large opening area, at the high squeegee speed $V_1$ and to print the minute opening area 121, which is the minute opening area, at the low squeegee speed $V_2$, and makes the generated program stored in the storage means 111b. This program will be used at Step #14.

At Step #2, under the control of the controller 111, the loader 117 carries the board 102 into the stage 113.

At Step #3, under the control of the controller 111, the visual recognition camera 107 recognizes the position of the recognition mark of the board 102, the controller 111 performs the calculation of a positional correction amount of the board 102 based on the position of the recognition mark of the screen metal mask 101, which is a stencil, and the controller 111 performs the positioning correction of the board 102 based on the calculated positional correction amount.

At Step #14, under the control of the controller 111, the squeegee 123 of the print head 103, which has a mechanism similar to that of the left squeegee 5a or the right squeegee 5b in the first embodiment, moves over and lowers to the print start position of the high-speed print area and prints from the print start position to the print end position of the high-speed print area at the high squeegee speed $V_1$, according to the operation program generated and stored at Step #11-2. Then, moving up to the print start position of the low-speed print area, the squeegee 123 prints from the print start position to the print end position of the low-speed print area at the low squeegee speed $V_2$. Then, moving up to the print start position of a second high-speed print area, the squeegee 123 prints from the print start position to the print end position of the second high-speed print area at the high squeegee speed $V_1$, and ascends.

Figure 7A:
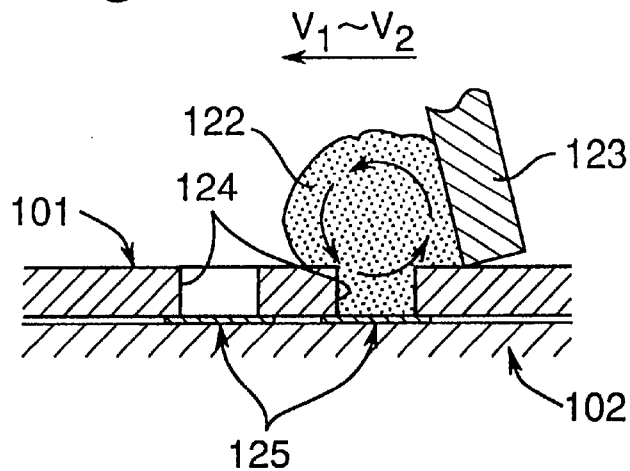
FIGS. 7A and 7B are views showing the operation of the printing method in the second embodiment.
Figure 7B:
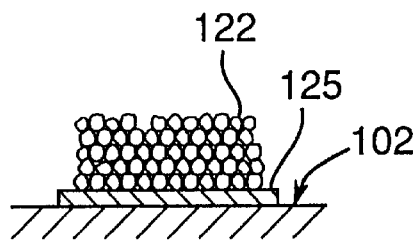

As a result, as shown in FIGS. 7A and 7B, the speeds $V_1$, $V_2$ of the squeegee 123 are suited to the large opening area 120, which is the high-speed print area, and the minute opening area 121, which is the low-speed print area, respectively, so that, even for the minute opening area 121, which is the minute opening area, the solder paste 122 can completely fill the interior of the print holes 124 which are openings of the screen metal mask 101 positioned on the electrodes 125 of the board 102. Thus, after the screen metal mask 101 is removed off, an appropriate amount of the solder paste 122 is printed on each of the electrodes 125 of the board 102, as shown in FIG. 7B.

At Step #5, under the control of the controller 111, the stage 113 having the board 102 placed thereon lowers so that the board 102 is transferred to the unloader 118, and then the unloader 118 carries the board 102 out of the screen printing apparatus main unit 119.

According to the second embodiment, in the way as described above, when areas corresponding to areas having different opening sizes of the mask 101 along the squeegee's moving direction of the mask 101 are mixedly present on the board 102, the printing can be carried out at a plurality of appropriate speeds matching the opening sizes of the various areas of the board 102, based on data entered by hand from the control panel 112.

A screen printing apparatus which employs a screen printing method according to a third embodiment of the present invention is described with reference to FIGS. 4A, 4B, and FIGS. 6 to 8.

General construction of the apparatus of this third embodiment is similar to that of the second embodiment, and such construction is omitted in description. In the second embodiment, it has been arranged that the high-speed print area and the low-speed print area are entered by hand into the controller 111. The third embodiment, however, is characterized by allowing the high-speed print area and the low-speed print area to be entered automatically with the use of the visual recognition camera 107. More specifically, the opening sizes of the openings of the mask are entered into the controller 111 by the recognition of the visual recognition camera 107, and each of the opening sizes is compared with a specified threshold by the controller 111. Then, it is decided by the controller 111 that an area where each of the opening sizes is smaller than the threshold is a low-speed print area, while an area where each of the opening sizes is not less than the threshold is a high-speed print area, and the decision results are stored in the storage means 111b.

Figure 8:
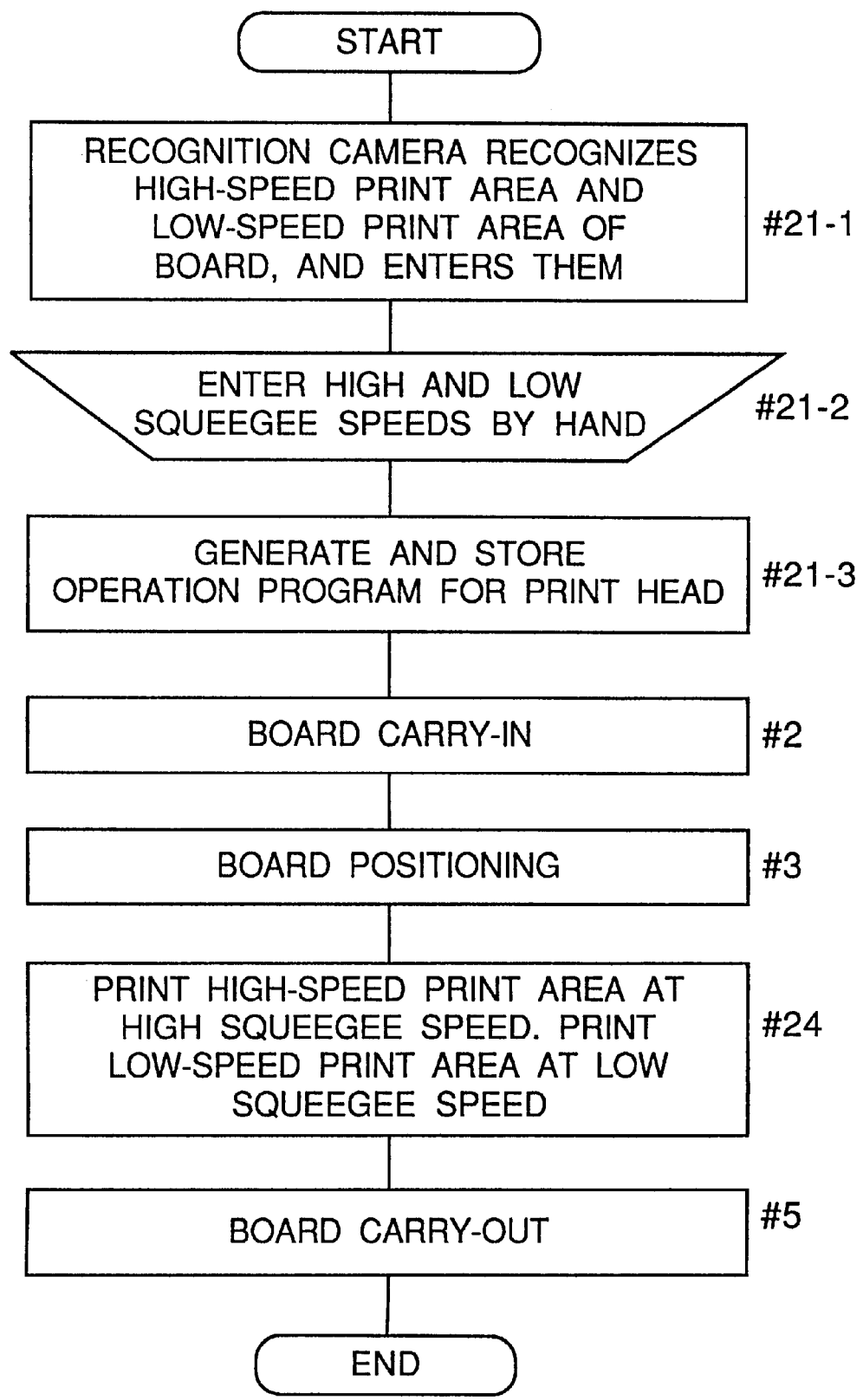
FIG. 8 is a flow chart showing the operation of a screen printing method according to a third embodiment of the present invention.

At Step #21-1 of FIG. 8, which shows the flow chart of the third embodiment, after installing the screen metal mask 101 upon a model exchange, the operator, with the use of the control panel 112, makes the screen metal mask 101 recognized by the visual recognition camera 107, and transfers, to the controller 111, data relating to the positions and sizes of the large opening area 120 and the minute opening area 121 of the screen metal mask 101.

At Step #21-2 of FIG. 8, the operator enters the high squeegee speed $V_1$ used for the printing of the high-speed print area and the low squeegee speed $V_2$ used for the printing of the low-speed print area, into the controller 111 by using the control panel 112.

At Step #21-3 of FIG. 8, with the use of these entered data, the controller 111 makes the program generating means 111c generate an operation program for the print head 103 to print the large opening area 120 at the high squeegee speed $V_1$ and to print the minute opening area 121 at the low squeegee speed $V_2$, and stores the program in the storage means 111b of the controller 111. This program will be used at Step #24 of FIG. 8.

At Step #2 of FIG. 8, under the control of the controller 111, the loader 117 carries the board 102 into the stage 113.

At Step #3 of FIG. 8, under the control of the controller 111, the visual recognition camera 107 recognizes the position of the recognition mark of the board 102, the controller 111 performs the calculation of a positional correction amount of the board 102 based on the position of the recognition mark of the screen metal mask 101, and the controller 111 performs the positioning correction of the board 102 based on the calculation result.

At Step #24 of FIG. 8, under the control of the controller 111, the print head 103 operates according to the program so that the squeegee 123 of the print head 103 moves over and lowers to the print start position of the high-speed print area and prints from the print start position to the print end position of the high-speed print area at the high squeegee speed $V_1$. Then, moving up to the print start position of the low-speed print area, the squeegee 123 prints from the print start position to the print end position of the low-speed print area at the low squeegee speed $V_2$. Then, moving up to the print start position of a second high-speed print area, the squeegee 123 prints from the print start position to the print end position of the second high-speed print area at the high squeegee speed $V_1$, and ascends.

At Step #5 of FIG. 8, under the control of the controller 111, the stage 113 having the board 102 placed thereon lowers so that the board 102 is transferred to the unloader 118, and then the unloader 118 carries the board 102 out of the main unit 119.

According to the third embodiment, in the way as described above, when areas corresponding to areas having different opening sizes of the mask are mixedly present on the board 102, the printing can be carried out at a plurality of appropriate speeds matching the opening sizes of the various areas of the board 102 semi-automatically.

A screen printing apparatus which employs a screen printing method according to a fourth embodiment of the present invention is described with reference to FIGS. 4A, 4B, 6, 7A, 7B, and 9.

General construction of the apparatus of this fourth embodiment is similar to that of the second embodiment, and is omitted in description. In the second embodiment, it has been arranged that the high-speed print area and the low-speed print area are recognized by the visual recognition camera 7 and discriminated by the controller 111. In the fourth embodiment, however, the controller 111 of this printing apparatus is so arranged that the data of the high-speed print area and the low-speed print area as well as the data of the high squeegee speed $V_1$ and the low squeegee speed $V_2$ are entered into the controller 111 of the printing apparatus from a higher-order (host) computer, for example, a controller of a mounting apparatus equipped with this printing apparatus.

Figure 9:
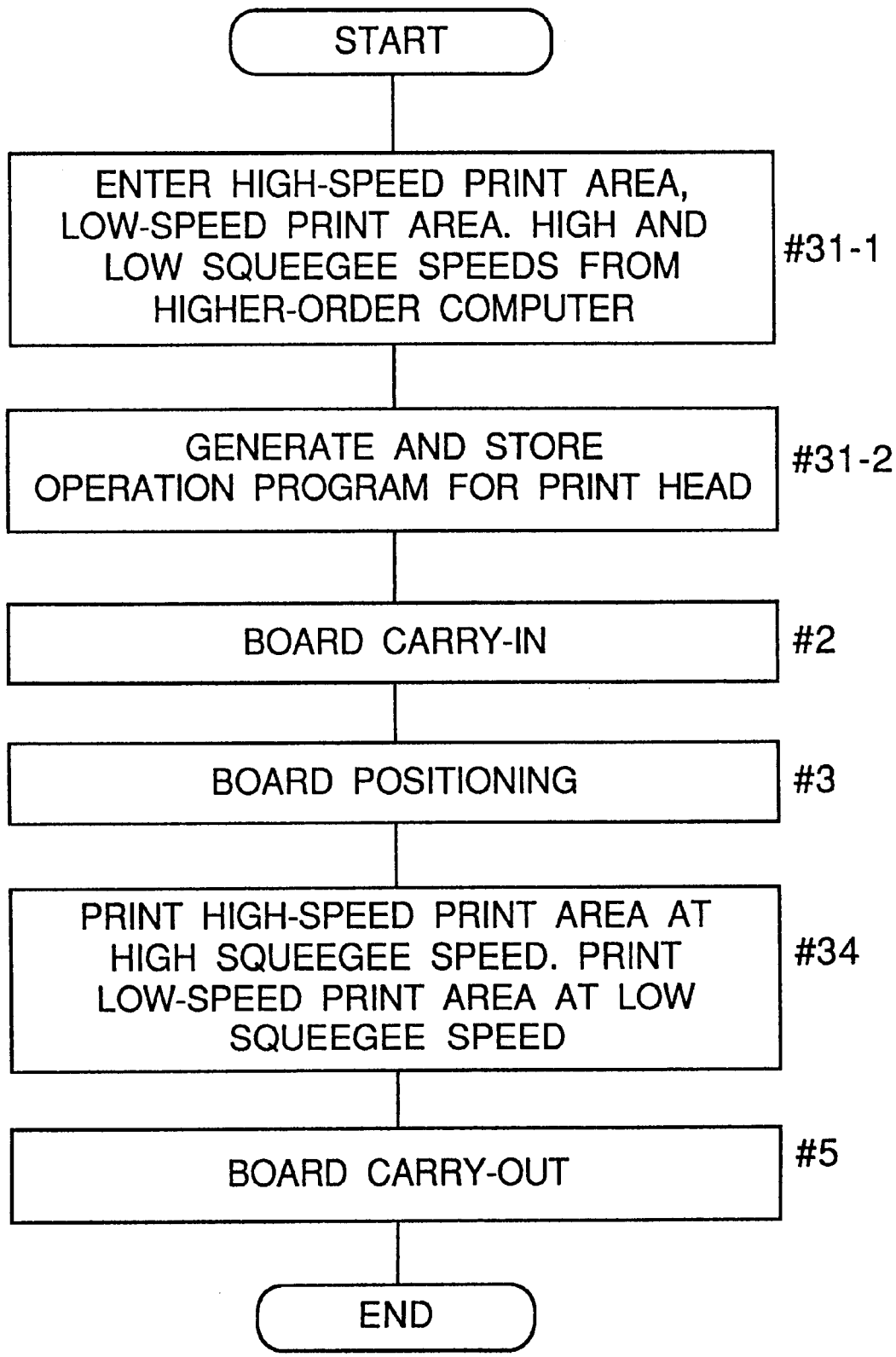
FIG. 9 is a flow chart showing the operation of a screen printing method according to a fourth embodiment of the present invention.

At Step #31-1 of FIG. 9, which shows the flow chart of the fourth embodiment, after the screen metal mask 101 is installed upon a model exchange, data relating to the positions and sizes of the large opening area 120 and the minute opening area 121 of the screen metal mask 101 as well as data of the high squeegee speed $V_1$ used for the printing of the large opening area 120 and the low squeegee speed $V_2$ used for the printing of the minute opening area 121 are transferred from the higher-order computer to the controller 111.

At Step #31-2 of FIG. 9, with the use of these entered data, the controller 111 makes the program generating means 111c generate an operation program for the print head 103 to print the large opening area 120 at the high squeegee speed $V_1$ and to print the minute opening area 121 at the low squeegee speed $V_2$, and stores the program in the storage means 111b. This program will be used at Step #34 of FIG. 9.

At Step #2 of FIG. 9, under the control of the controller 111, the loader 117 carries the board 102 into the stage 113.

At Step #3 of FIG. 9, under the control of the controller 111, the visual recognition camera 107 recognizes the position of the recognition mark of the board 102, the controller 111 performs the calculation of a positional correction amount of the board 102 based on the position of the recognition mark of the screen metal mask 101, and the controller 111 performs the positioning correction of the board 102 based on the calculation result.

At Step #34 of FIG. 9, under the control of the controller 111, the print head 103 operates according to the program so that the squeegee 123 of the print head 103 moves over and lowers to the print start position of the high-speed print area and prints from the print start position to the print end position of the high-speed print area at the high squeegee speed $V_1$. Then, moving up to the print start position of the low-speed print area, the squeegee 123 prints from the print start position to the print end position of the low-speed print area at the low squeegee speed $V_2$. Then, moving up to the print start position of a second high-speed print area, the squeegee 123 prints from the print start position to the print end position of the second high-speed print area at the high squeegee speed $V_1$, and ascends.

At Step #5 of FIG. 9, under the control of the controller 111, the stage 113 having the board 102 placed thereon lowers so that the board 102 is transferred to the unloader 118, and then the unloader 118 carries the board 102 out of the main unit 119.

According to the fourth embodiment, in the way as described above, when areas corresponding to areas having different opening sizes of the mask are mixedly present on the board 102, the printing can be carried out at a plurality of appropriate speeds matching the opening sizes of the various areas of the board 102 semi-automatically, which correspond to the areas having the different opening sizes.

Figure 10:
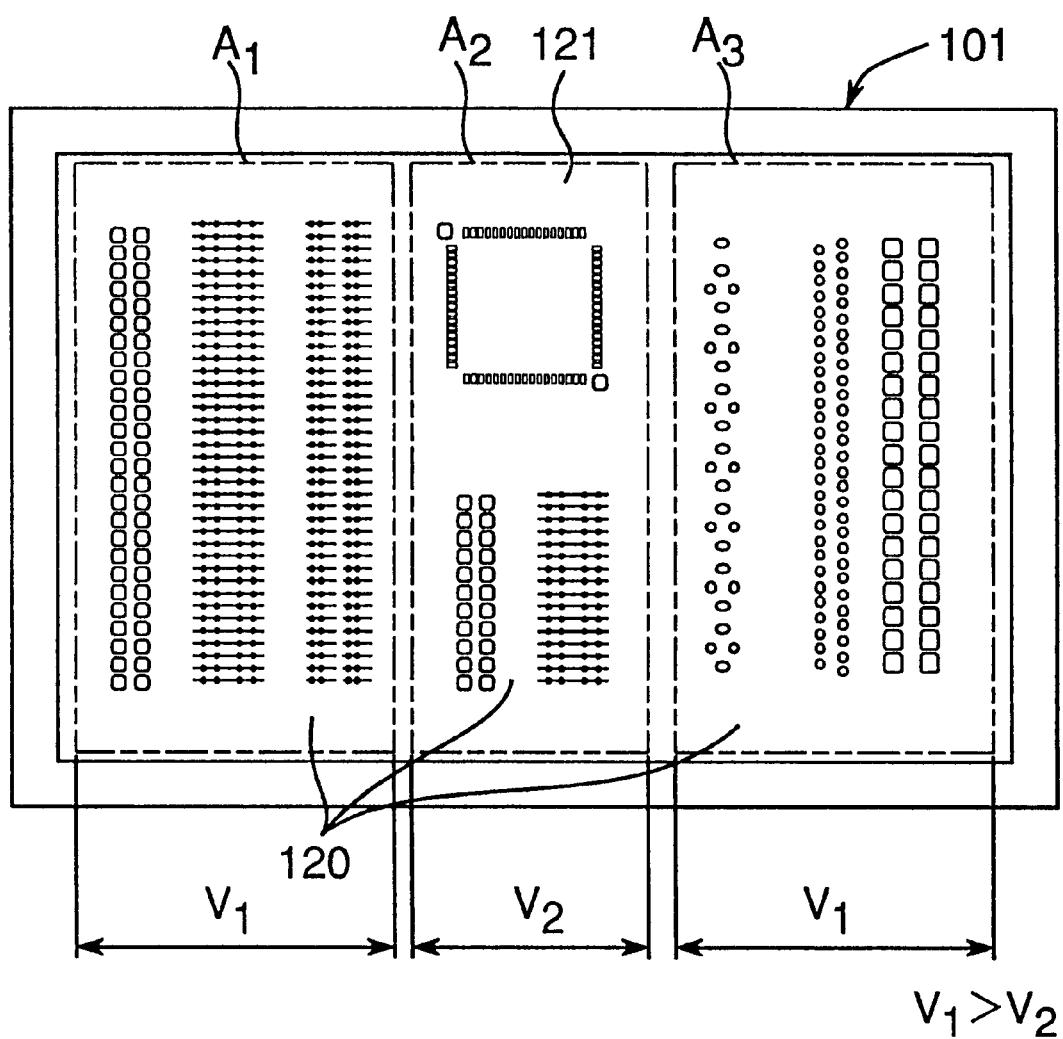
FIG. 10 is a plan view of a screen metal mask used in a screen printing method according to a modification of the second embodiment.

FIG. 10 shows a modification example of the fourth embodiment. In the fourth embodiment, the high-speed print areas and the low-speed circuit areas are classified on the assumption that an area where components with generally equal external terminal pitches will be mounted is present along the direction perpendicular to the squeegee's moving direction. However, as shown in FIG. 10, there are some cases in which components to be mounted with largely different external terminal pitches are arranged along the direction perpendicular to the squeegee's moving direction. More specifically and left-end, right-end areas $A_1$, $A_3$ of the screen metal mask 101 of FIG. 10 are large opening areas 120 as in the screen metal mask 101 of FIG. 6, whereas a central area $A_2$ has a minute opening area 121 at its upper portion of FIG. 10 and a large opening area 120 at its lower portion. In such an area where the minute opening area 121 and the large opening area 120 are mixedly present along the direction perpendicular to the squeegee's moving direction, the lower of the print speeds is preferentially employed so that the printing of circuits corresponding to the minuter opening areas of the mask will be carried out appropriately. Therefore, the screen metal mask 101 of FIG. 10 is printed in the order of speeds $V_1$, $V_2$, $V_1$, as in the case of the print speed of the screen metal mask 101 of FIG. 6.

As an example of the specified threshold for the value of the size of the opening 124 of the mask 101 for classifying the large opening areas and the minute opening areas, if the narrow pitch between the external terminals of an electronic component to be mounted most frequently on a board is 0.5 mm and the width of the terminal is 0.18±0.02 mm and the thickness of the mask is 0.15 mm, then the threshold may be set to 0.25 mm which is half of 0.5 mm. Accordingly, an area where electronic components each having an external terminal pitch less than 0.25 mm are to be mounted is printed at a lower print speed as the minute opening area, while an area where electronic components each having an external terminal pitch not less than 0.25 mm are to be mounted is printed at a higher print speed as the large opening area. The threshold is variable depending on the pitch between the external terminals, the width of the terminal, the mask thickness etc.

A screen printing method and a printing apparatus according to a fifth embodiment of the present invention are now described with reference to FIGS. 11 to 15.

This fifth embodiment is a screen printing method for screen-printing a print paste at a reference print speed by using a squeegee, in which method upon an occurrence of print standby time during a printing operation, this print standby time is measured, and when the printing operation is resumed with the print standby state canceled, the squeegee is moved at an adjusted print speed lower than the reference print speed based on the relationship between the print standby time and the adjusted print speed after the resumption of printing, by which the screen printing is carried out with the print paste that has been placed on the screen mask during the standby time.

Figure 13:
FIG. 13 is a view showing the operation of a squeegee in the screen printing apparatus of FIG. 12.
Figure 14:
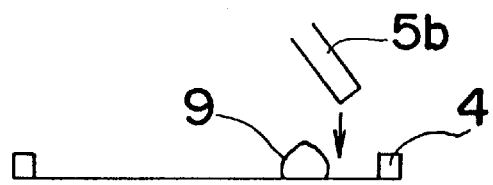
FIG. 14 is a view showing the operation of the squeegee in the screen printing apparatus of FIG. 12.
Figure 15:
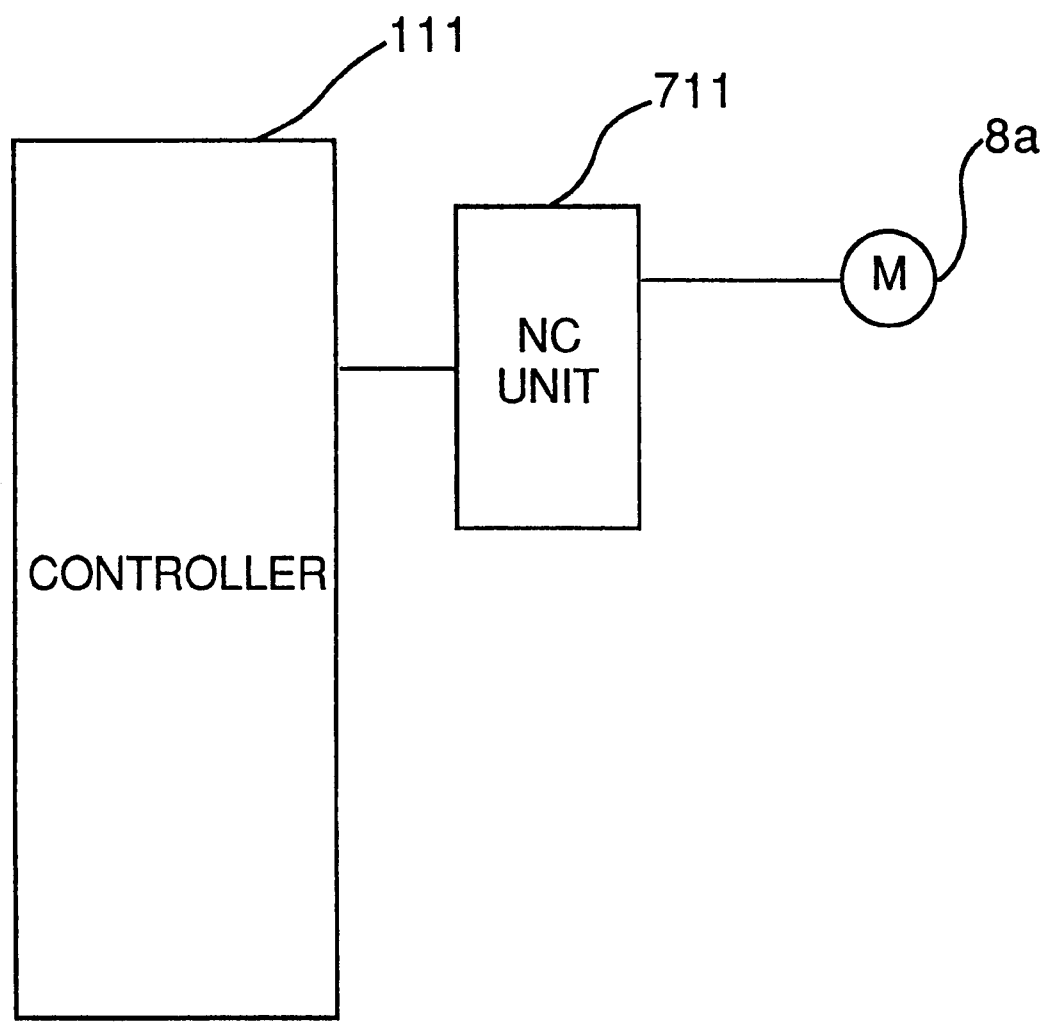
FIG. 15 is a block diagram of the control mechanism and a drive mechanism of the screen printing apparatus of the fifth embodiment.
Figure 16:
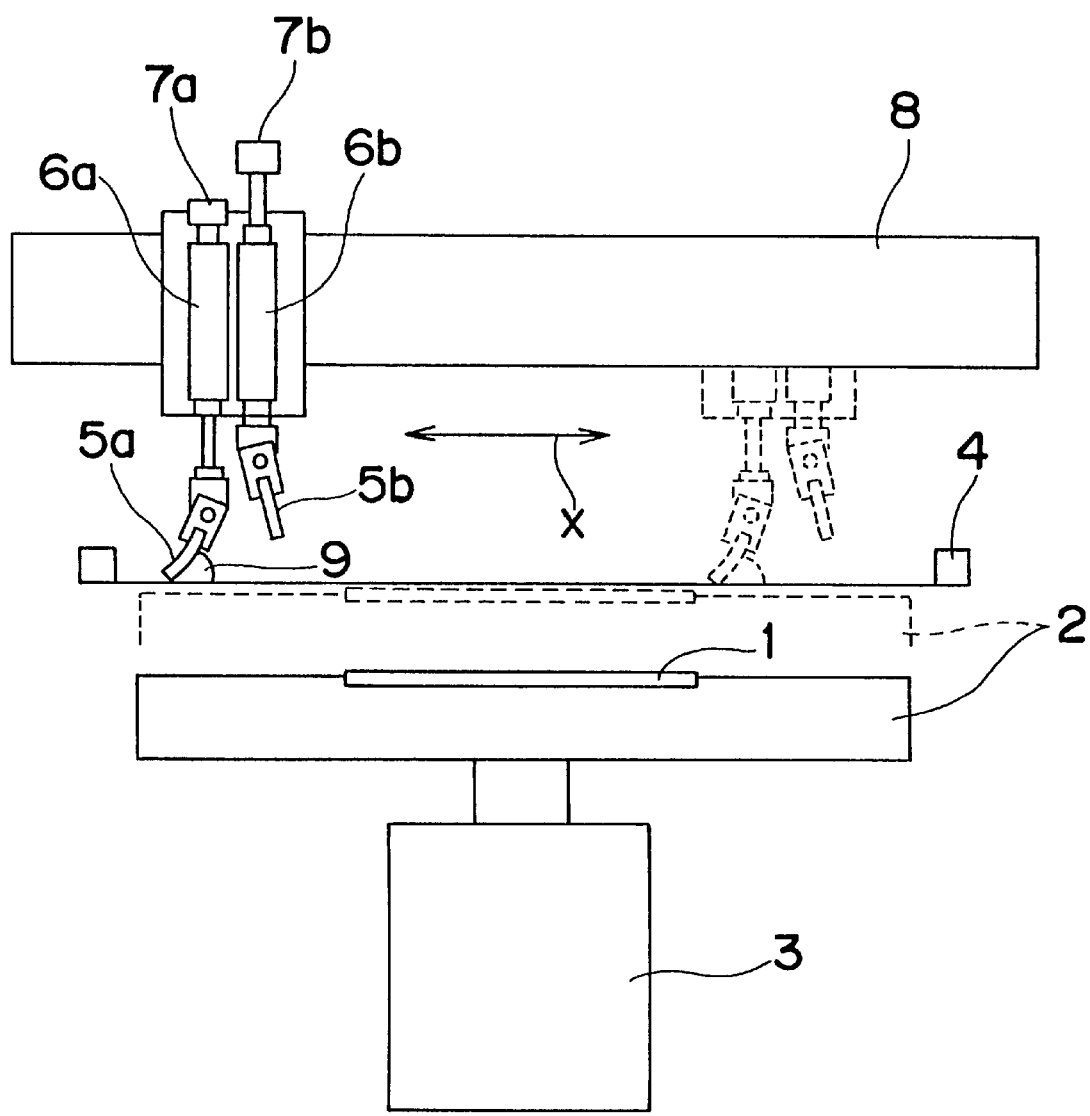
FIG. 16 is an arrangement diagram of a conventional screen printing apparatus.
Figure 17:
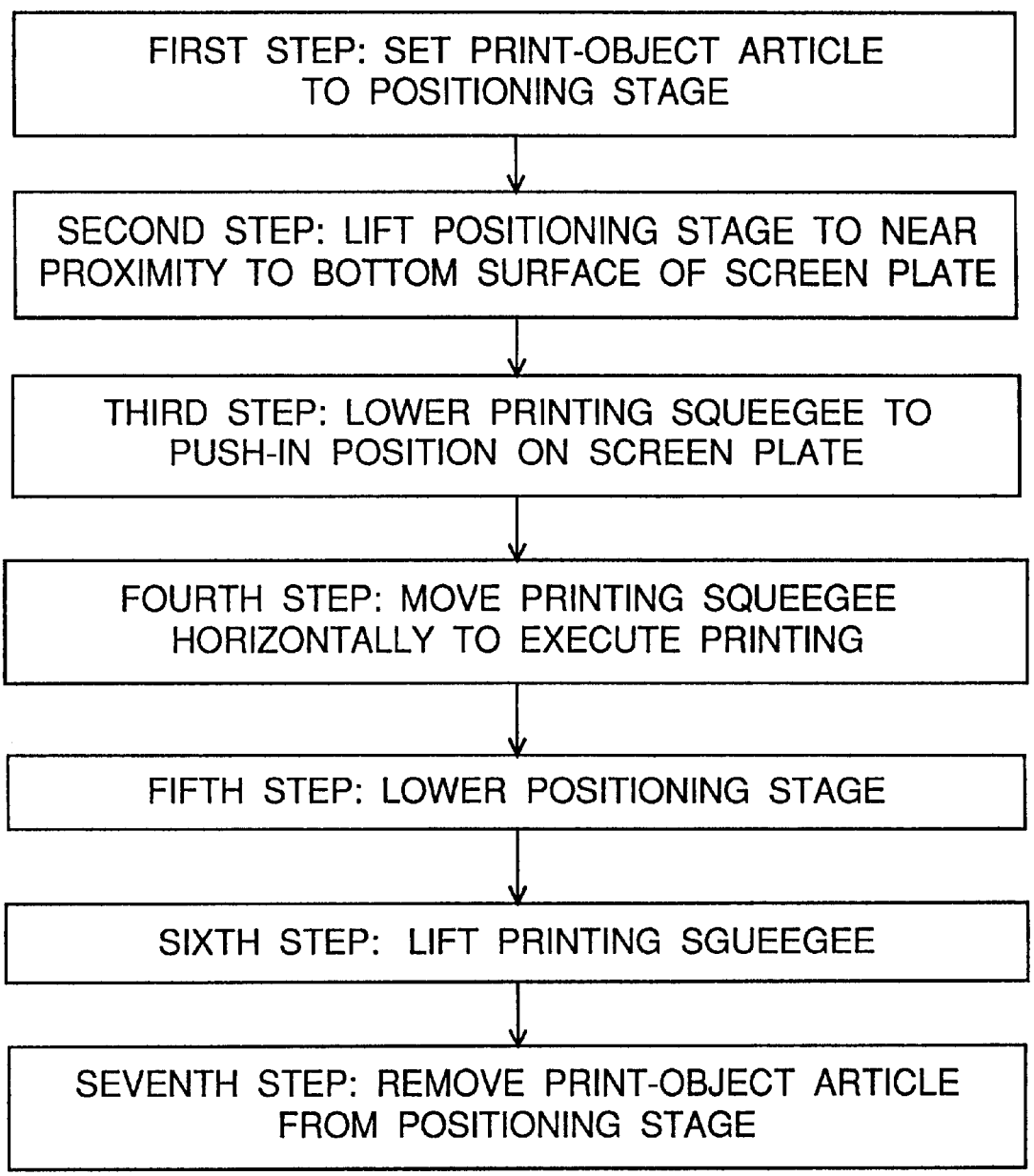
FIG. 17 is a flow chart of the conventional screen printing method.
Figure 18A:
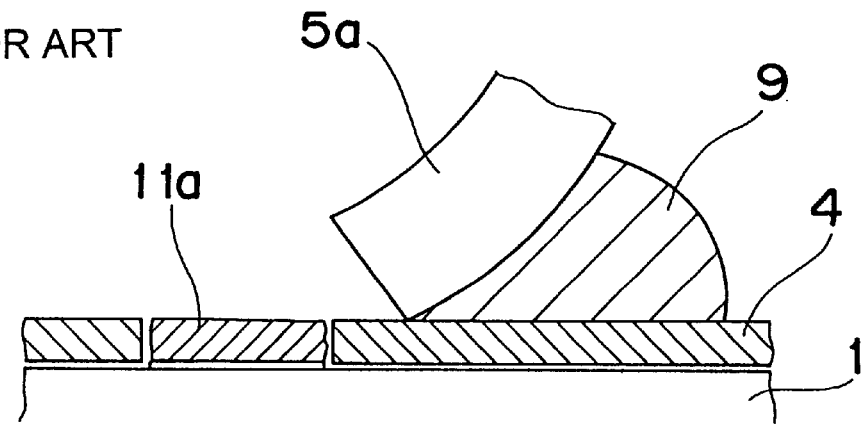
FIGS. 18A, 18B, and 18C are explanatory views of the printing process of the conventional screen printing method.
Figure 18B:
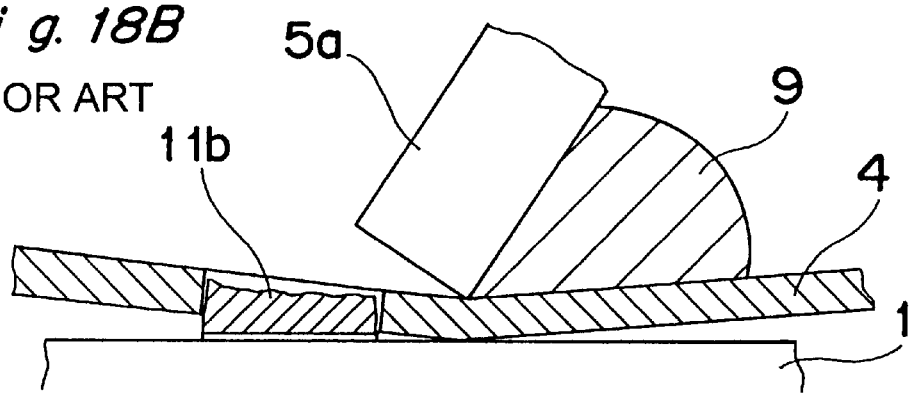
Figure 18C:
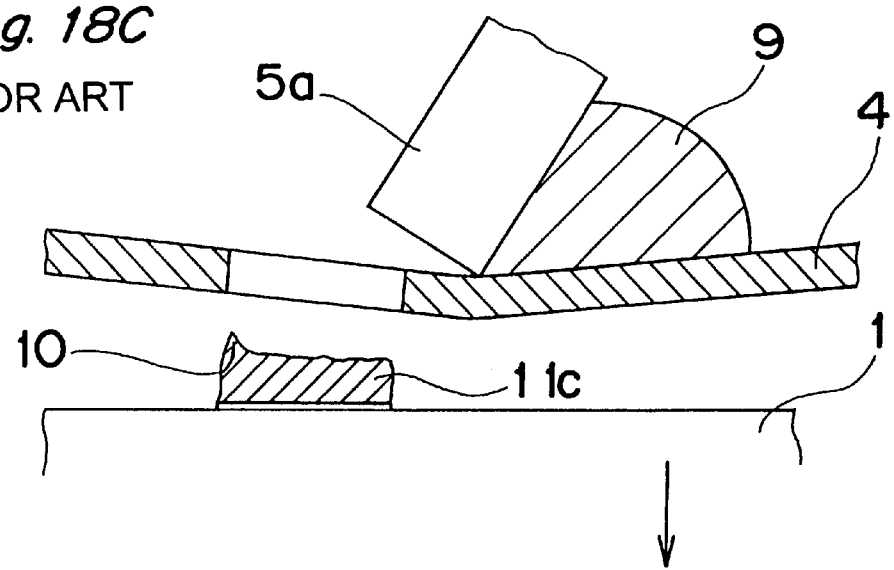
Figure 19:
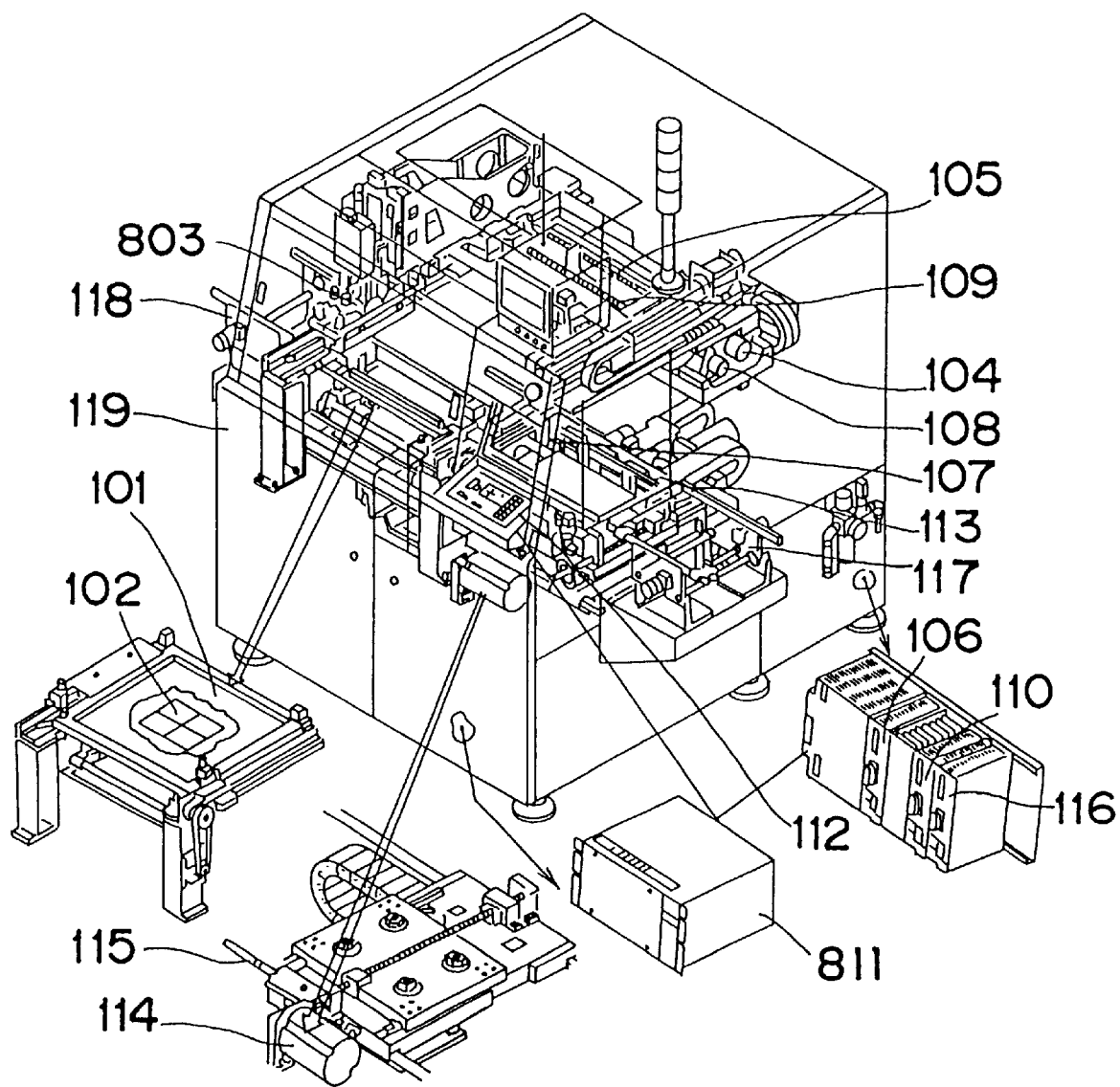
FIG. 19 is a perspective view of a conventional screen printing apparatus.
Figure 20:
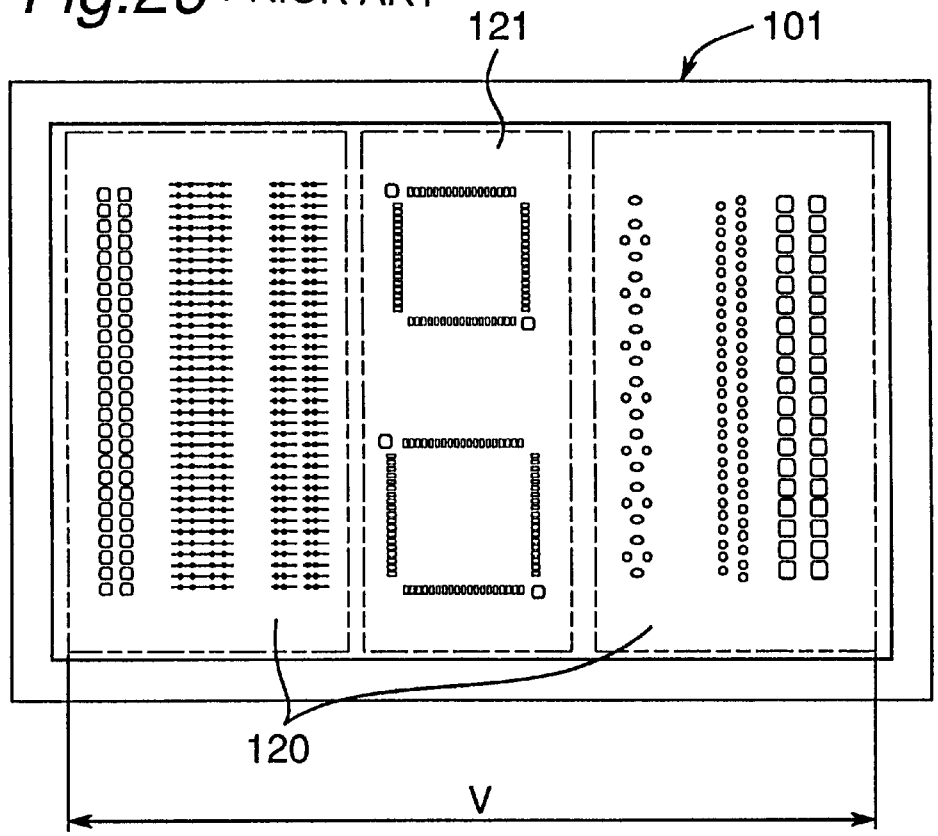
FIG. 20 is a plan view of a conventional screen metal mask.
Figure 21A:
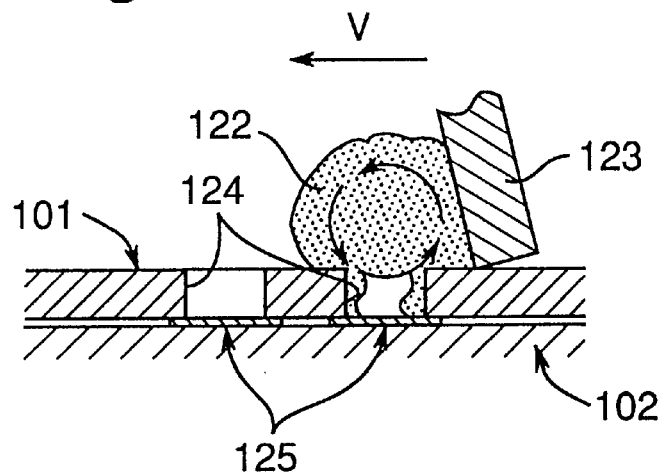
FIGS. 21A and 21B are views showing the operation of a conventional example.
Figure 21B:
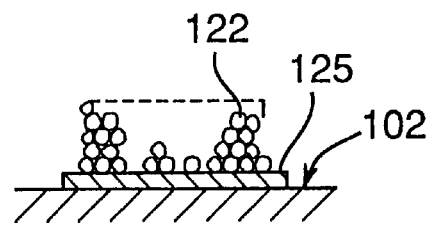
Figure 22:
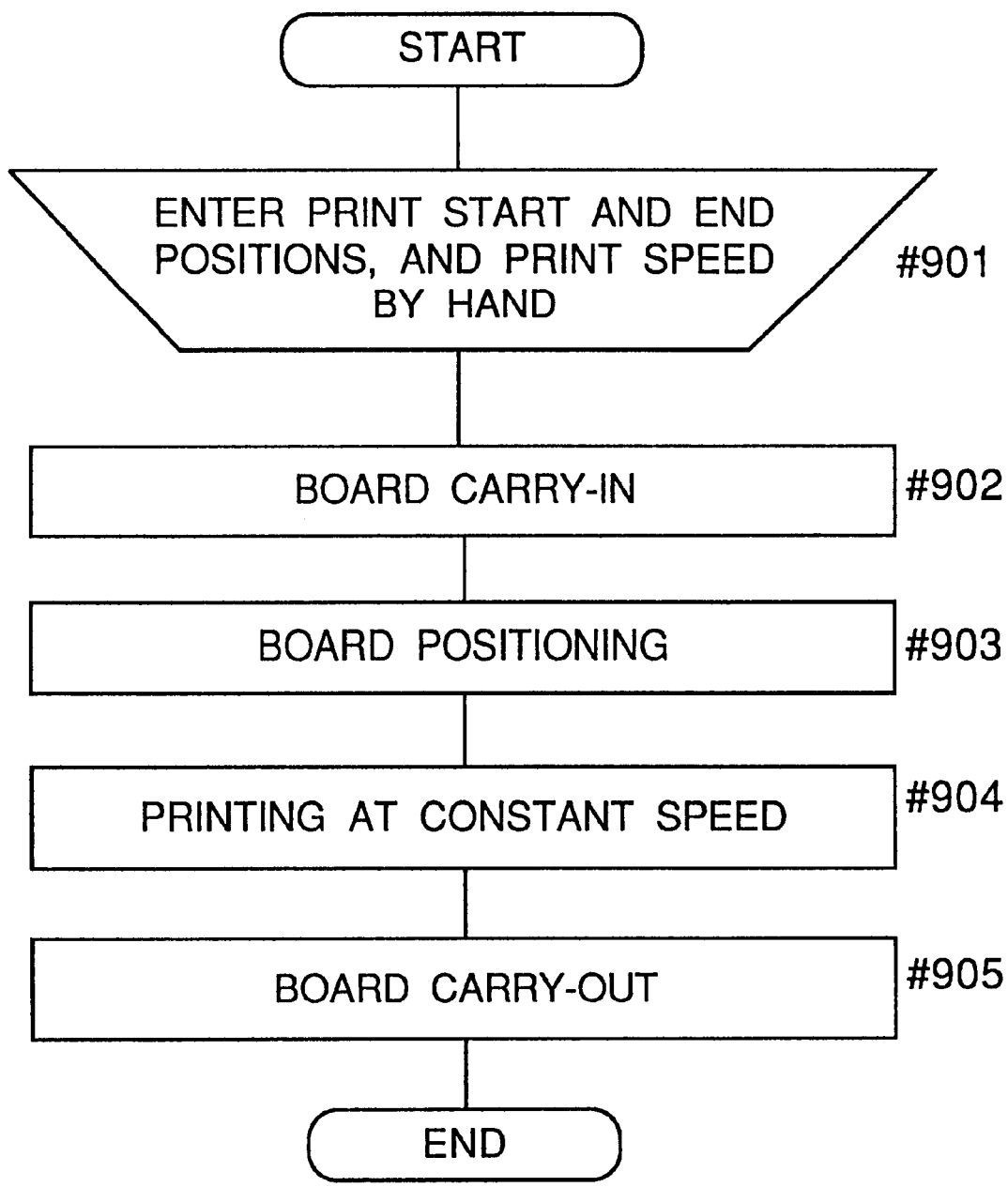
FIG. 22 is a flow chart showing the operation of a conventional example.
Figure 23:
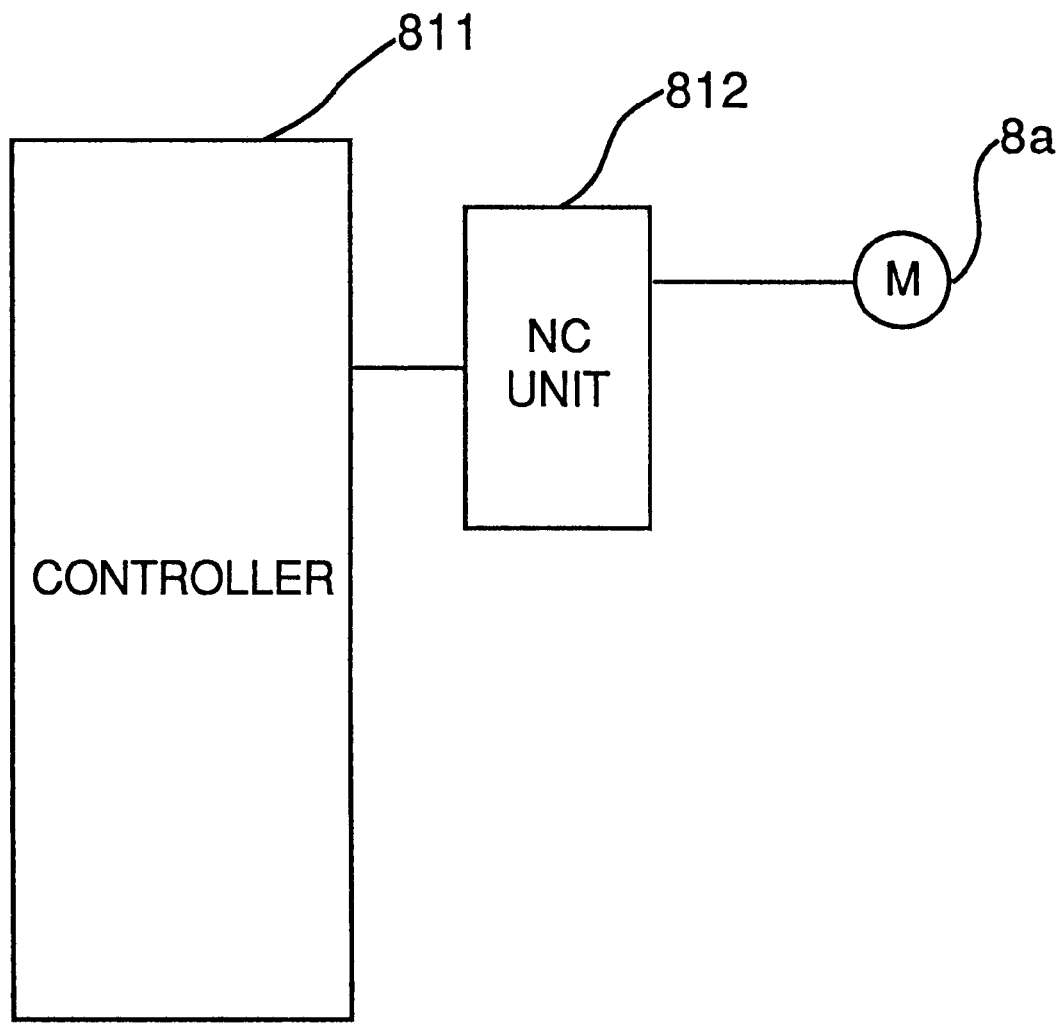
FIG. 23 is a block diagram of a control mechanism and a drive mechanism of a conventional screen printing apparatus.
Figure 24:
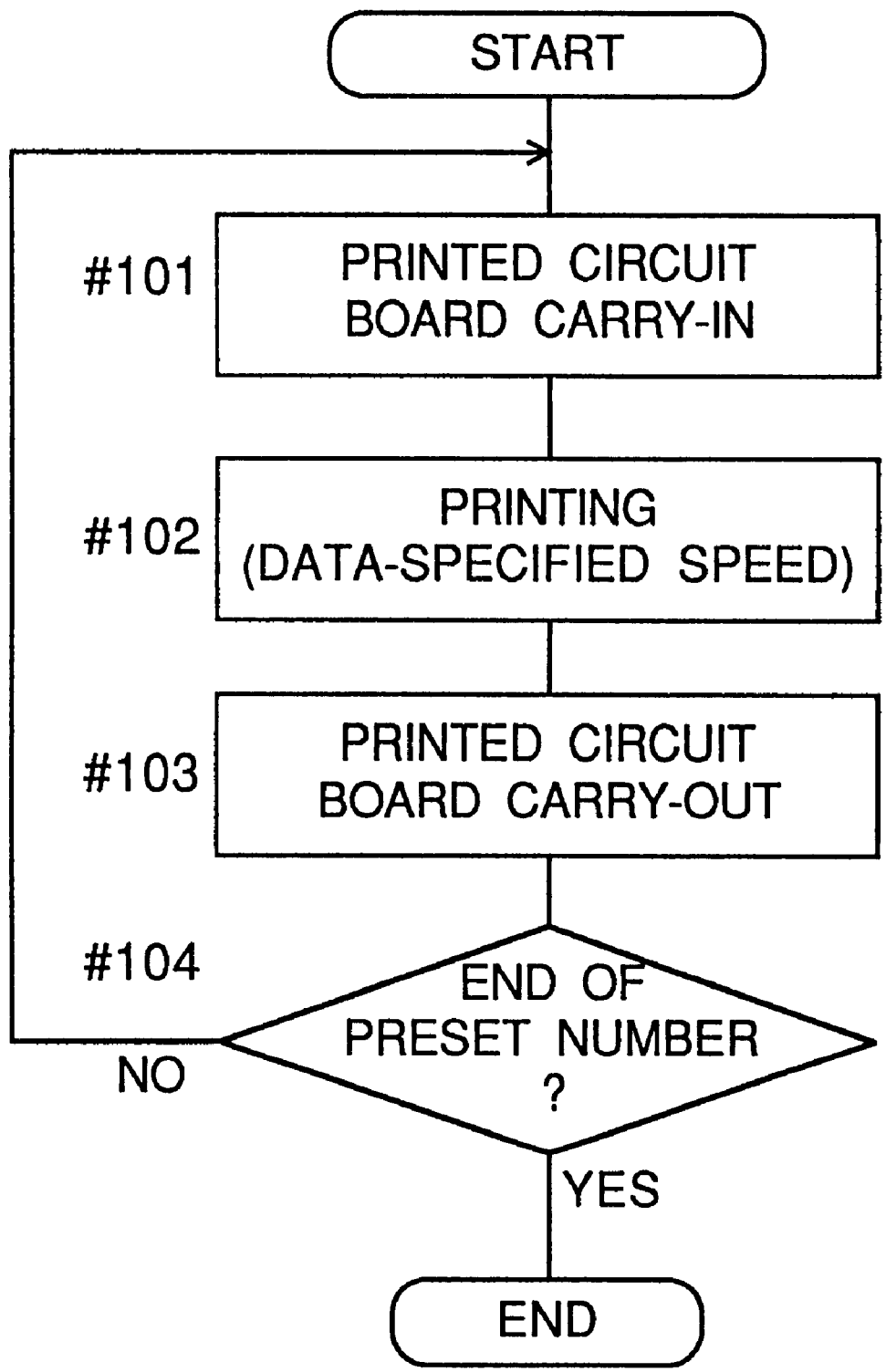
FIG. 24 is a flow chart showing the operation of the conventional screen printing method.

This printing apparatus has a construction generally similar to that of the foregoing embodiments. The stage 2, on which the printed circuit board 1 carried in from the preceding step is placed and positionally restricted, ascends up to the bottom surface of the stencil 4. After the printing, the stage 2 lowers so that the printed circuit board 1 is carried out to the subsequent step. The leftward printing squeegee 5a and the rightward printing squeegee 5b are moved up and down by the squeegee ascent/descent driving unit 700, while the squeegees 5a, 5b are moved rightward and leftward by the horizontal mover 8c screwed to the screw shaft 8b with the screw shaft 8b being rotated by the rotation of the motor 8a of the horizontal reciprocation driving unit 8, so that solder paste 9, which is an example of the print paste placed on the stencil 4, is printed to the printed circuit board 1 through the stencil 4. FIGS. 12 and 13 each show a state of a rightward printing process, and FIG. 14 shows a printing standby state for a leftward printing process. Reference numeral 711 in FIG. 15 denotes an NC unit for issuing a command to drive the motor 8a, and numeral 111 denotes the controller for controlling the whole printing apparatus.

In this fifth embodiment, the following operation is executed under the control of the controller 111.

Figure 11:
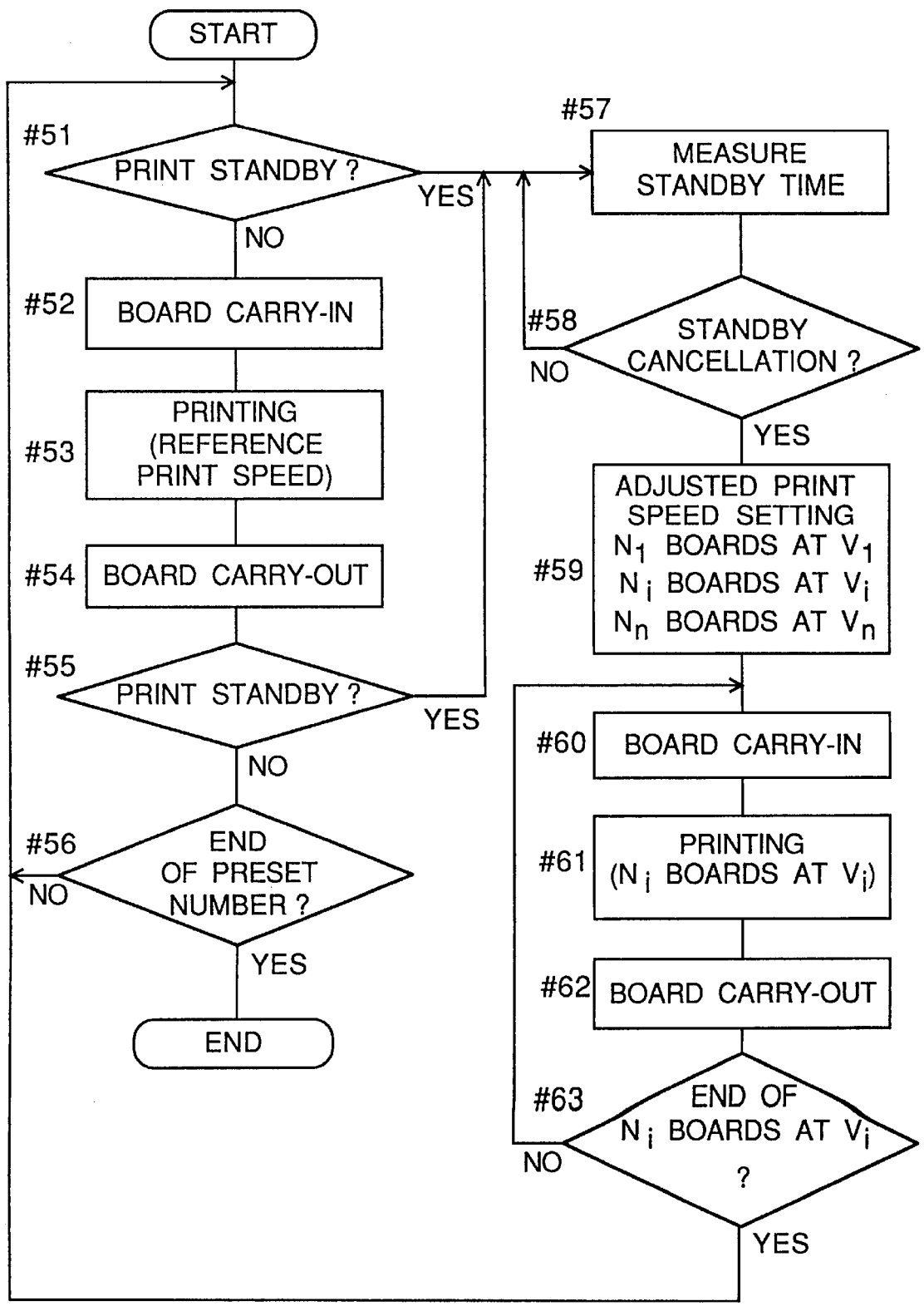
FIG. 11 is a flow chart showing the operation of a screen printing method according to a fifth embodiment of the present invention.

At Step #51 of FIG. 11, a print-standby presence/absence decision step, it is decided whether or not there is a print standby state over a specified time elapse due to some reason of the preceding step. If there is no print standby state, the program goes to Steps #52 to #56, which are a normal process. If there is a print standby state, the program goes to Steps #57 to #63, which are a standby process.

In the normal process, through the steps of Step #52, which is a board carry-in step (corresponding to Step #2 of FIGS. 5, 8, 9), Step #53, which is a printing step (corresponding to Steps #14, #24, #34 of FIGS. 5, 8, 9), and Step #54, which is a board carry-out step (corresponding to Step #5 of FIGS. 5, 8, 9), it is decided at Step #55, a print-standby presence/absence decision step, whether or not there is a print standby state over a specified time elapse due to some reason of the subsequent step. If there is no print standby state, the program goes to Step #56; if there is, it goes to Steps #57 to #63, which are a standby process. At Step #56, which is an end discrimination step, if an end has not been reached, the program returns to Step #51. If the end has been reached at Step #56, the program comes to the end.

In the standby process, while the standby time is measured at Step #57, it is decided at Step #58, a decision step, whether or not there is a standby cancellation. If there is a standby cancellation, the program goes to Step #59. If there is no standby cancellation, it repeats Steps #57 and #58 until the standby cancellation occurs.

At Step #59, which is a print speed setting step, an adjusted print speed Vi (mm/sec) is set in accordance with the standby time measured at Step #57, and then stored in the storage means 111b of the controller 111.

In this case, with a normal solder paste, the adjusted print speed Vi that allows an appropriate rolling characteristic to be maintained during a post-standby printing process decreases proportionally to the standby state. Therefore, the adjusted print speeds Vi that allow an appropriate rolling characteristic to be maintained can be easily determined previously for various lengths of standby time. Even if the adjusted print speed Vi that allows the rolling characteristic to be maintained during the post-standby printing process does not decrease proportionally to the standby time, the adjusted print speeds Vi that allow the rolling characteristic to be maintained can also be experimentally determined previously for various lengths of standby time, taking advantage of the unique tendencies inherent to various solder pastes.

As one example of the fifth embodiment, with a solder paste whose reference print speed V for normal process is 40 mm/sec, the relationship between the print standby time and the adjusted print speed Vi that allows an appropriate rolling characteristic to be maintained during a post-standby printing process was experimentally determined. As a result, it was found appropriate as a reference criterion that, with a standby time of about one hour, a first adjusted print speed $V_1=10$ mm/sec should be employed at the start, in which state $N_1$ boards are printed at the speed should $V_1$, then the speed be changed to a second adjusted print speed $V_2=20$ mm/sec, at which $N_2$ boards are printed, and thereafter the speed should be changed to a third adjusted print speed $V_3=30$ mm/sec, at which $N_3$ boards are printed, and then the speed should be returned to the reference print speed V=40 mm/sec for the normal process. It is noted that the values of the number of boards, $N_1$ to $N_3$, to be printed at the individual adjusted print speeds are those experimentally determined when a specified amount of solder paste is resupplied. Since resupplied new solder paste is usually higher in viscosity than the solder paste remaining on the stencil, the values of $N_1$ to $N_3$ that allow appropriate rolling characteristic to be obtained should be increased or decreased according to the resupply amount of solder paste.

If the adjusted print speed Vi for various types of standby time as well as the number Ni of boards responsive to the resupply amount of new solder paste are previously determined in accordance with the above criteria, then the adjusted print speeds Vi and the number Ni of boards to be printed can be set responsively to the characteristics of solder paste that have changed during the standby time.

At Steps #60 to #63, the printing of a specified number Ni of boards at the adjusted print speed Vi is completed, and then, the program returns to Step #51. That is, Steps #60, #61, and #62 nearly correspond to Steps #52, #53, and #54, respectively. The difference between them is that the printing at Step #61 is executed at the adjusted print speed Vi on Ni boards, whereas the printing at Step #54 is executed at the reference print speed. At Step #63, it is decided whether or not the specified number Ni of boards have been completely carried out at the adjusted print speed Vi. If the specified number Ni of boards have not yet been completed, the program returns to Step #60, and then, the printing is further executed. If it is decided at Step #63 that the specified number Ni of boards have been completely printed, the program returns to Step #51.

With this arrangement, even if the characteristics of solder paste, such as viscosity, have changed during the print standby, the rolling characteristic of solder paste, which is a critical factor of the solder paste printing, can be maintained by printing at the adjusted print speed. Therefore, the occurrence of such faults as solder chipping, solder shortages, or blurs can be prevented so that a stable print quality can be ensured.

Also, the number of adjusted prints, or the number of boards to be printed at the adjusted print speed is set responsively to the resupply amount of new print paste, and after the number of adjusted prints have been completely printed at the adjusted print speed, the print speed is returned to the reference print speed. Therefore, there can be obtained an advantage that the print speed can be returned to the reference print speed without causing any faults such as print paste chipping, print paste shortages, or blurs.

In the fifth embodiment, the time duration for which the screen printing is executed at the adjusted print speed by the controller 15 has been set responsive to the resupply amount of print paste. However, the present invention is not limited to this.

For example, it may alternatively be arranged by the controller 15 that over a specified time elapse after the screen printing is started at the adjusted print speed, the screen printing is executed at the reference print speed, which is independent of the resupply amount of print paste. It may also be arranged by the controller 15 that upon completing the printing of a specified number of boards after the screen printing is started at the adjusted print speed, the screen printing is executed at the reference print speed. Further, the adjusted print speed until the print speed is returned to the reference print speed may be set into a plurality of steps by the controller 15, which is independent of the resupply amount of print paste. According to this printing method, in addition to the advantages of the printing method of the present invention, there can be obtained a further advantage that a wide range of short to long print standby times can be well handled because a one-step adjusted print speed may appropriately be adopted for a shorter print standby time, while the number of steps of adjusted print speed may appropriately be increased as the print standby time becomes longer.

Although the present invention has been fully described in conjunction with preferred embodiments thereof with reference to the accompanying drawings, various changes and modifications will be apparent to those skilled in the art. Therefore, unless such changes and modifications depart from the scope of the present invention as defined by the appended claims, they should be construed as being included therein.

What is claimed is:

1. A screen printing method for printing a circuit pattern corresponding to a circuit pattern of a stencil, onto a print-object article placed on an ascendable/descendable positioning stage, through a moving of a squeegee horizontally while the squeegee is pushed in on a top surface of the stencil having the circuit pattern formed thereon so that print paste is printed and applied to the print-object article via the stencil, the screen printing method comprising:

lifting the squeegee at least to an extent of a push-in stroke, to which the squeegee has been pushed in on the stencil; and separating the print-object article away from a bottom surface of the stencil by moving the positioning stage downward while the squeegee is brought into contact with the stencil.

2. The screen printing method according to claim 1, wherein an ascent standby position of the squeegee above the stencil prior to the pushing-in, a push-in position of the squeegee to the stencil, and a monetary position at which the squeegee is present at a moment when the squeegee makes contact with the top surface of the stencil are each entered in numerical value into a controller of a screen printing apparatus, and wherein the controller makes the following specified operations to be executed at the positions entered in numerical value, the screen printing method, before the lifting and the separating further comprising:

keeping the squeegee on standby at the ascent standby position before a start of the screen printing; and lowering the squeegee from the ascent standby position to the push-in position, and making the squeegee execute the push-in operation to thereby execute a printing operation;

wherein the lifting, upon completion of the printing operation, the squeegee is lifted from the push-in position to the momentary position at which the squeegee is present at a moment when the squeegee makes contact with the top surface of the stencil.

3. The screen printing method according to claim 2, wherein the squeegee is moved up and down relative to the stencil by digital control.

4. The screen printing method according to claim 1 wherein the squeegee is moved up and down relative to the stencil by digital control.

5. A screen printing apparatus for printing a circuit pattern corresponding to a circuit pattern of a stencil, onto a print-object article placed on an ascendable/descendable positioning stage, through a moving of a squeegee horizontally while the squeegee is pushed in on a top surface of the stencil having the circuit pattern formed thereon so that print paste is printed and applied to the print-object article via the stencil, the screen printing apparatus comprising:

a controller for controlling a squeegee ascent/descent driving unit and a positioning stage ascent/descent driving unit in such a way that the squeegee is lifted at least to an extent of a push-in stroke, to which the squeegee has been pushed in on the stencil, and then, the print-object article is separated away from a bottom surface of the stencil by moving the positioning stage downward while the squeegee is brought into contact with the stencil.

6. The screen printing apparatus according to claim 5, wherein an ascent standby position of the squeegee above the stencil prior to the pushing-in, a push-in position of the squeegee to the stencil to which the squeegee has been pushed in on the stencil, and a momentary position at which the squeegee is present at a moment when the squeegee makes contact with the top surface of the stencil are entered each in numerical value from an input device into the controller, and wherein the controller makes the following specified operations executed at the positions entered in numerical value, wherein:

the squeegee is brought and kept on standby at the ascent standby position by the squeegee ascent/descent driving unit before a start of the screen printing;

the squeegee is lowered from the ascent standby position to the push-in position by the squeegee ascent/descent driving unit, and the squeegee is made to execute the push-in operation to thereby execute a printing operation;

upon completion of the printing operation, when the squeegee is lifted to the extent of the push-in stroke, the squeegee is lifted by the squeegee ascent/descent driving unit from the push-in position to the momentary position at which the squeegee is present at a moment when the squeegee makes contact with the top surface of the stencil; and the positioning stage is lowered by the positioning stage ascent/descent driving unit so as to separate the print-target article away from the bottom surface of the stencil.

7. The screen printing apparatus according to claim 6, wherein the squeegee ascent/descent driving unit comprises a motor, a screw shaft connected to a rotary shaft of the motor, and a mover which is screwed to the screw shaft and which moves the squeegee along upward and downward directions, wherein the upward and downward movement of the squeegee is controlled by rotational control of the motor.

8. The screen printing apparatus according to claim 6, wherein the squeegee is moved up and down relative to the stencil by digital control with the controller.

9. The screen printing apparatus according to claim 6, wherein after the squeegee is lifted by the squeegee ascent/descent driving unit at least to the extent of the push-in stroke, to which the squeegee has been pushed in on the stencil, the positioning stage moves downward by the positioning stage ascent/descent driving unit at a speed slower than a speed at which the squeegee is lifted, whereby the print-object article is separated away from the bottom surface of the stencil, and thereafter the squeegee is lifted up to its standby position by the squeegee ascent/descent driving unit.

10. The screen printing apparatus according to claim 5, wherein the squeegee ascent/descent driving unit comprises a motor, a screw shaft connected to a rotary shaft of the motor, and a mover which is screwed to the screw shaft and which moves the squeegee along upward and downward directions, wherein the upward and downward movement of the squeegee is controlled by rotational control of the motor.

11. The screen printing apparatus according to claim 10, wherein the squeegee is moved up and down relative to the stencil by digital control with the controller.

12. The screen printing apparatus according to claim 10, wherein after the squeegee is lifted by the squeegee ascent/descent driving unit at least to the extent of the push-in stroke, to which the squeegee has been pushed in on the stencil, the positioning stage moves downward by the positioning stage ascent/descent driving unit at a speed slower than a speed at which the squeegee is lifted, whereby the print-object article is separated away from the bottom surface of the stencil, and thereafter the squeegee is lifted up to its standby position by the squeegee ascent/descent driving unit.

13. The screen printing apparatus according to claim 5, wherein the squeegee is moved up and down relative to the stencil by digital control with the controller.

14. The screen printing apparatus according to claim 13, wherein after the squeegee is lifted by the squeegee ascent/descent driving unit at least to the extent of the push-in stroke, to which the squeegee has been pushed in on the stencil, the positioning stage moves downward by the positioning stage ascent/descent driving unit at a speed slower than a speed at which the squeegee is lifted, whereby the print-object article is separated away from the bottom surface of the stencil, and thereafter the squeegee is lifted up to its standby position by the squeegee ascent/descent driving unit.

15. The screen printing apparatus according to claim 5, wherein after the squeegee is lifted by the squeegee ascent/descent driving unit at least to the extent of the push-in stroke, to which the squeegee has been pushed in on the stencil, the positioning stage moves downward by the positioning stage ascent/descent driving unit at a speed slower than a speed at which the squeegee is lifted, whereby the print-object article is separated away from the bottom surface of the stencil, and thereafter the squeegee is lifted up to its standby position by the squeegee ascent/descent driving unit.

* * * * *